(12) United States Patent
McCormick et al.

(10) Patent No.: US 8,846,169 B2
(45) Date of Patent: Sep. 30, 2014

(54) FLEXIBLE ENCAPSULATING FILM SYSTEMS

(75) Inventors: Fred B. McCormick, Maplewood, MN (US); Mark A. Roehrig, Stillwater, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 302 days.

(21) Appl. No.: 12/810,115

(22) PCT Filed: Dec. 19, 2008

(86) PCT No.: PCT/US2008/087668
§ 371 (c)(1),
(2), (4) Date: Jun. 22, 2010

(87) PCT Pub. No.: WO2009/086095
PCT Pub. Date: Jul. 9, 2009

(65) Prior Publication Data
US 2010/0272933 A1    Oct. 28, 2010

Related U.S. Application Data

(60) Provisional application No. 61/017,482, filed on Dec. 28, 2007.

(51) Int. Cl.
*B32B 1/02* (2006.01)
*B32B 23/00* (2006.01)
*B32B 1/08* (2006.01)

(52) U.S. Cl.
USPC ....... 428/34.1; 428/34.2; 428/35.7; 428/35.9; 428/36.9

(58) Field of Classification Search
USPC ............... 428/34.1, 34.2, 35.7, 35.9, 36.9
See application file for complete search history.

(56) References Cited

U.S. PATENT DOCUMENTS

| | | | |
|---|---|---|---|
| 2,621,193 A | 12/1952 | Langkammerer |
| 3,529,074 A | 5/1968 | Lewis |
| 3,601,471 A | 8/1971 | Seddon |
| 4,486,561 A | 12/1984 | Chung et al. |
| 4,537,814 A | 8/1985 | Itoh et al. |
| 4,629,756 A | 12/1986 | Kerbow |
| 4,645,714 A | 2/1987 | Roche et al. |
| 4,696,719 A | 9/1987 | Bischoff |
| 4,722,515 A | 2/1988 | Ham |

(Continued)

FOREIGN PATENT DOCUMENTS

| | | |
|---|---|---|
| CN | 1771127 | 5/2006 |
| EP | 0 777 280 | 6/1997 |

(Continued)

OTHER PUBLICATIONS

"Polymethyl Methacrylate"—Wikipedia (last edited Jun. 29, 2011) (printed Jun. 30, 2011).

(Continued)

*Primary Examiner* — Marc Patterson
(74) *Attorney, Agent, or Firm* — Lisa P. Fulton; James A. Baker

(57) ABSTRACT

An encapsulating film system comprises (a) a flexible barrier film, (b) an adhesive on at least a portion of the flexible barrier film, and (c) a desiccant on at least a portion of the flexible barrier film or the adhesive.

18 Claims, 3 Drawing Sheets

(56) References Cited

U.S. PATENT DOCUMENTS

| | | | |
|---|---|---|---|
| 4,732,879 A | 3/1988 | Kalinowski et al. | |
| 4,782,216 A | 11/1988 | Woodard | |
| 4,786,783 A | 11/1988 | Woodard | |
| 4,842,893 A | 6/1989 | Yializis et al. | |
| 4,954,371 A | 9/1990 | Yializis | |
| 5,018,048 A | 5/1991 | Shaw et al. | |
| 5,032,461 A | 7/1991 | Shaw et al. | |
| 5,097,800 A | 3/1992 | Shaw et al. | |
| 5,104,929 A | 4/1992 | Bilkadi | |
| 5,125,138 A | 6/1992 | Shaw et al. | |
| 5,260,095 A | 11/1993 | Affinito | |
| 5,324,374 A | 6/1994 | Harmand et al. | |
| 5,332,888 A | 7/1994 | Tausch et al. | |
| 5,356,947 A | 10/1994 | Ali et al. | |
| 5,409,683 A | 4/1995 | Tillotson et al. | |
| 5,440,446 A | 8/1995 | Shaw et al. | |
| 5,464,667 A | 11/1995 | Kohler et al. | |
| 5,530,581 A | 6/1996 | Cogan | |
| 5,547,508 A | 8/1996 | Affinito | |
| 5,547,908 A | 8/1996 | Furuzawa et al. | |
| 5,681,666 A | 10/1997 | Treger et al. | |
| 5,686,360 A | 11/1997 | Harvey, III et al. | |
| 5,725,909 A | 3/1998 | Shaw et al. | |
| 5,736,207 A | 4/1998 | Walther et al. | |
| 5,773,102 A | 6/1998 | Rehfeld | |
| 5,858,526 A | 1/1999 | Floch et al. | |
| 5,395,644 A | 3/1999 | Affinito | |
| 5,925,438 A | 7/1999 | Ota et al. | |
| 5,991,081 A | 11/1999 | Haaland et al. | |
| 6,004,660 A | 12/1999 | Topolski et al. | |
| 6,022,812 A | 2/2000 | Smith et al. | |
| 6,045,864 A | 4/2000 | Lyons et al. | |
| 6,083,628 A | 7/2000 | Yializis | |
| 6,132,882 A | 10/2000 | Landin et al. | |
| 6,146,225 A | 11/2000 | Sheats et al. | |
| 6,214,422 B1 | 4/2001 | Yializis | |
| 6,224,948 B1 | 5/2001 | Affinito | |
| 6,231,939 B1 | 5/2001 | Shaw et al. | |
| 6,268,694 B1 | 7/2001 | Fujimoto | |
| 6,268,695 B1 | 7/2001 | Affinito | |
| 6,288,842 B1 | 9/2001 | Florczak et al. | |
| 6,335,479 B1 | 1/2002 | Yamada et al. | |
| 6,348,237 B2 | 2/2002 | Kohler et al. | |
| 6,352,761 B1 | 3/2002 | Hebrink et al. | |
| 6,358,570 B1 | 3/2002 | Affinito | |
| 6,368,699 B1 | 4/2002 | Gilbert et al. | |
| 6,413,645 B1 | 7/2002 | Graff et al. | |
| 6,492,026 B1 | 12/2002 | Graff et al. | |
| 6,497,598 B2 | 12/2002 | Affinito | |
| 6,570,325 B2 | 5/2003 | Graff et al. | |
| 6,573,652 B1 | 6/2003 | Graff et al. | |
| 6,613,088 B1 | 9/2003 | Babizhayev et al. | |
| 6,623,861 B2 | 9/2003 | Martin et al. | |
| 6,627,267 B2 | 9/2003 | Affinito | |
| 6,638,569 B2 * | 10/2003 | McLaughlin et al. | 427/249.3 |
| 6,641,874 B2 | 11/2003 | Kuntz et al. | |
| 6,660,339 B1 | 12/2003 | Datta et al. | |
| 6,720,203 B2 | 4/2004 | Carcia et al. | |
| 6,743,488 B2 | 6/2004 | Memarian et al. | |
| 6,743,948 B1 | 6/2004 | Hosokawa et al. | |
| 6,765,351 B2 | 7/2004 | Forrest et al. | |
| 6,797,396 B1 | 9/2004 | Liu et al. | |
| 1,771,127 A1 | 10/2004 | Padiyath | |
| 6,811,867 B1 | 11/2004 | McGurran et al. | |
| 6,830,713 B2 | 12/2004 | Hebrink et al. | |
| 6,867,539 B1 | 3/2005 | McCormick et al. | |
| 6,888,305 B2 | 5/2005 | Weaver | |
| 6,929,864 B2 | 8/2005 | Fleming et al. | |
| 6,933,051 B2 | 8/2005 | Fleming et al. | |
| 6,936,131 B2 | 8/2005 | McCormick et al. | |
| 6,975,067 B2 | 12/2005 | McCormick et al. | |
| 6,991,826 B2 | 1/2006 | Pellerite et al. | |
| 7,015,640 B2 | 3/2006 | Schaepkens et al. | |
| 7,018,713 B2 * | 3/2006 | Padiyath et al. | 428/411.1 |
| 7,189,447 B2 | 3/2007 | Conway et al. | |
| 7,215,473 B2 | 5/2007 | Fleming | |
| 7,410,261 B2 | 8/2008 | Magarill | |
| 7,486,019 B2 | 2/2009 | Padiyath et al. | |
| RE40,787 E | 6/2009 | Martin et al. | |
| 2002/0022156 A1 | 2/2002 | Bright | |
| 2002/0176993 A1 | 11/2002 | Graff et al. | |
| 2003/0108749 A1 | 6/2003 | Ram | |
| 2003/0148128 A1 | 8/2003 | Tomaru et al. | |
| 2003/0197197 A1 * | 10/2003 | Brown et al. | 257/200 |
| 2003/0198830 A1 | 10/2003 | Kim et al. | |
| 2003/0213967 A1 | 11/2003 | Forrest et al. | |
| 2004/0018305 A1 | 1/2004 | Pagano et al. | |
| 2004/0032658 A1 | 2/2004 | Fleming | |
| 2004/0107905 A1 | 6/2004 | Sheu | |
| 2004/0114101 A1 | 6/2004 | Thakrar | |
| 2004/0121146 A1 | 6/2004 | He et al. | |
| 2005/0023974 A1 * | 2/2005 | Chwang et al. | 313/512 |
| 2005/0089673 A1 | 4/2005 | Fleming et al. | |
| 2005/0112378 A1 | 5/2005 | Naruse et al. | |
| 2006/0087230 A1 | 4/2006 | Ghosh et al. | |
| 2006/0099725 A1 | 5/2006 | Shioya et al. | |
| 2006/0199014 A1 | 9/2006 | Il et al. | |
| 2007/0020451 A1 | 1/2007 | Padiyath | |
| 2007/0084381 A1 | 4/2007 | Sanbayashi et al. | |
| 2007/0231484 A1 | 10/2007 | Hishiya et al. | |
| 2008/0196664 A1 | 8/2008 | David et al. | |
| 2008/0292810 A1 | 11/2008 | Anderson et al. | |
| 2010/0073936 A1 | 3/2010 | Padiyath et al. | |
| 2010/0089621 A1 | 4/2010 | Stoss et al. | |
| 2011/0229637 A1 | 9/2011 | Yasui et al. | |
| 2012/0003448 A1 | 1/2012 | Weigel et al. | |
| 2012/0003451 A1 | 1/2012 | Weigel et al. | |

FOREIGN PATENT DOCUMENTS

| | | |
|---|---|---|
| EP | 0 915 105 | 5/1999 |
| EP | 1 555 687 | 7/2005 |
| EP | 1 645 657 | 4/2006 |
| JP | 1-283136 | 11/1989 |
| JP | 4-14440 | 1/1992 |
| JP | 04-267097 | 9/1992 |
| JP | 6-316728 | 11/1994 |
| JP | 11-255923 | 9/1999 |
| JP | 2002-532850 | 10/2002 |
| JP | 2003-53881 | 2/2003 |
| JP | 2003-191370 | 7/2003 |
| JP | 2006-175633 | 7/2006 |
| JP | 2007-81350 | 3/2007 |
| JP | 2007-220402 | 8/2007 |
| TW | 200711844 | 4/2007 |
| WO | WO 97/16053 | 5/1997 |
| WO | WO 00/02241 | 1/2000 |
| WO | WO 00/26973 | 5/2000 |
| WO | WO 00/36665 | 6/2000 |
| WO | WO 01/03856 | 1/2001 |
| WO | WO 01/16044 | 3/2001 |
| WO | WO 01/58989 | 8/2001 |
| WO | WO 01/96115 | 12/2001 |
| WO | WO 02/090107 | 11/2002 |
| WO | WO 03/015589 | 2/2003 |
| WO | WO 2004/016560 | 2/2004 |
| WO | WO 2004/017701 | 2/2004 |
| WO | WO 2006/093702 | 9/2006 |
| WO | WO 2007/084386 | 7/2007 |
| WO | WO 2007/087281 | 8/2007 |
| WO | WO 2007/149683 | 12/2007 |
| WO | WO 2008/027863 | 3/2008 |
| WO | WO 2008/083304 | 7/2008 |
| WO | WO 2008/083310 | 7/2008 |

OTHER PUBLICATIONS

Affinito et al., "Polymer-Oxide Transparent Barrier Layers", Society of Vacuum Coaters 39th Annual Technical Conference Proceedings, Paper No. W-12, (1996), pp. 1-6.

Affinito et al., "Vacuum Deposited Polymer/Metal Multilayer Films for Optical Application", *Thin Solid Films* 270, (1995), pp. 43-48.

Bright et al., "Advances in Vacuum Web Coating", AIMCAL Fall Technical Conference Proceedings (1999), Abstract, 1 page.

(56) References Cited

OTHER PUBLICATIONS

Bright et al., "New Applications for Polymer Multi-Layer Technology", AIMCAL Fall Technical Conference Proceedings (1998), Abstract, 1 page.

Bright et al., "Transparent Barrier Coatings Based on ITO for Flexible Plastic Displays", Proceedings of the Thirteenth International Conference on Vacuum Web Coatings (1999), Abstract, 18 pages.

Bright et al., "Transparent and Conductive Ultra-barrier Coatings for Flexible Plastic Displays", American Vacuum Society, 46th International Symposium, Conference Proceedings (1999).

Jone et al., "An Improved Metallized Film Capacitor Using a New Acrylate Coating Process", Journal of Plastic Film & Sheeting, vol. 13, Apr. 1997, pp. 150-158.

Liu et al., "Fundamental studies of a new hybrid (inorganic-organic) positively charged membrane. II. Membrane preparation via alcoholysis reaction and amination processes of silicone and titanate coupling agents", *Journal of Membrane Science* 264 (2005), pp. 87-96.

Roehrig et al., "Vacuum Heat Transfer Models for Web Substrates: Review of Theory and Experimental Heat Transfer Data", 2000 *Society of Vacuum Coaters*, 43rd Annual Technical Conference Proceedings, Apr. 2000, pp. 335-341.

Shaw et al., "A New High Speed Process for Vapor Depositing Acrylate Thin Films: An Update", Society of Vacuum Coaters 36th Annual Technical Conference Proceedings, (1993), pp. 348-352.

Shaw et al., "A New Vapor Deposition Process for Coating Paper and Polymer Webs", 6th International Vacuum Coating Conference, (1992), pp. 96-101.

Shaw et al., "Use of Evaporated Acrylate Coatings to Smooth the Surface of Polyester and Polypropylene Film and Aluminum Foil Substrates", RadTech '96 North America UV/EB Conference Proceedings, vol. II, (1996), pp. 701-707.

Shaw et al., "Use of Vapor Deposited Acrylate Coatings to Improve the Barrier Properties of Metallized Film", Society of Vacuum Coaters 37th Annual Technical Conference Proceeding (1994), pp. 240-247.

Bradley et al., "The Hydrolysis of Titanium Tetraethoxide", *J. Chem. Soc.*, (1955), pp. 721-726.

Bradley et al., "Structural Aspects of the Hydrolysis of Titanium Tetraethoxide", *J. Chem. Soc.*, (1955), pp. 3977-3982.

Brochure, DuPont™ Tyzor® Organic Titanates and Zirconates, (2008).

Karmakar et al., "Alkoxide Hydrolysis and Preparation of $TiO_2$ Powders", *Transactions of the Indian Ceramic Society*, 44 (1), (1985), pp. 10-14.

Stupl et al., "High Energy Lasers: A Sensible Choice for Future Weapon Systems?", Security Challenges, vol. 1, No. 1, 2005, pp. 135-153.

\* cited by examiner

FLEXIBLE ENCAPSULATING FILM SYSTEMS

FIELD

The present invention relates to encapsulating film systems for electronic devices. In another aspect, this invention relates to methods for protecting an electronic device.

BACKGROUND

Many electronic devices such as, for example, organic light emitting diodes (OLEDs), organic photovoltaic devices (OPVs), organic transistors, inorganic electroluminescent films, and inorganic solar cells (for example, CIGS (copper indium gallium selenide) solar cells) can be sensitive to the oxygen and moisture present in the ambient atmosphere. Research has therefore been undertaken to develop encapsulation methods and systems to protect electronic devices from oxygen and moisture and thus improve device lifetimes. There has been some success in encapsulating rigid devices on substrates such as glass with glass or metal caps.

A conventional glass-to-glass OLED encapsulation, for example, is illustrated in FIG. 1. Typically, multiple OLEDs are fabricated on a glass substrate (the "mother glass") 102; however, for simplification, only one OLED 100 is shown on the mother glass 102 in FIG. 1. The mother glass 102 is encapsulated with a glass cover sheet 104 using an adhesive 106 (for example, a UV cured epoxy adhesive). The glass cover sheet 104 contains etched pockets 108, which contain a desiccant 110 (for example, CaO). The adhesive 106 is typically dispensed such that it forms an adhesive gasket surrounding each individual OLED 100 on the mother glass 102. After the adhesive 106 is cured, the encapsulated OLEDs are separated (for example, using a scribe-and-break procedure on the mother glass 102 and the glass cover sheet 104) into individual encapsulated OLEDs.

SUMMARY

In view of the foregoing, we recognize that there is a need for flexible encapsulating film systems as replacements for the glass and metal caps currently in use in order to lower the costs associated with encapsulation and to provide thinner and lighter end devices such as OLED displays.

Briefly, in one aspect, the present invention provides a flexible encapsulating film system comprising (a) a flexible barrier film, (b) an adhesive on at least a portion of the flexible barrier film, and (c) a desiccant on at least a portion of the flexible barrier film or the adhesive.

In another aspect the present invention provides a singulated flexible encapsulating film system. The singulated system comprises one or more flexible barrier lids adhered to a carrier web. The flexible barrier lid comprises (a) a flexible barrier film, (b) an adhesive on at least a portion of the flexible barrier film, and (c) a desiccant on at least a portion of the flexible barrier film or the adhesive.

The flexible encapsulating film systems of the invention are ready for lamination to an electronic device (for example, an organic electronic device (OED)) by a device fabricator and advantageously eliminate the steps of applying the desiccant and adhesive in the device fabrication plant.

The flexible encapsulating film systems and the method of the invention meet the need in the art for thinner and lighter encapsulating systems for electronic devices.

In yet another aspect, the present invention provides a method of protecting an electronic device. The method comprises (a) providing a substrate comprising one or more electronic devices, and (b) adhering an encapsulating film system of the invention to the substrate such that the one or more electronic devices are encapsulated by the encapsulating film system.

In still another aspect, the present invention provides methods of making flexible encapsulation film systems. One method comprises (a) providing a flexible barrier film, (b) depositing desiccant on at least a portion of the flexible barrier film, and (c) depositing adhesive on at least a portion of the flexible barrier film. Another method comprises (a) providing a flexible barrier film; depositing adhesive on at least a portion of the flexible barrier film, and (c) depositing desiccant on at least a portion of the adhesive.

DETAILED DESCRIPTION

Figure 1:
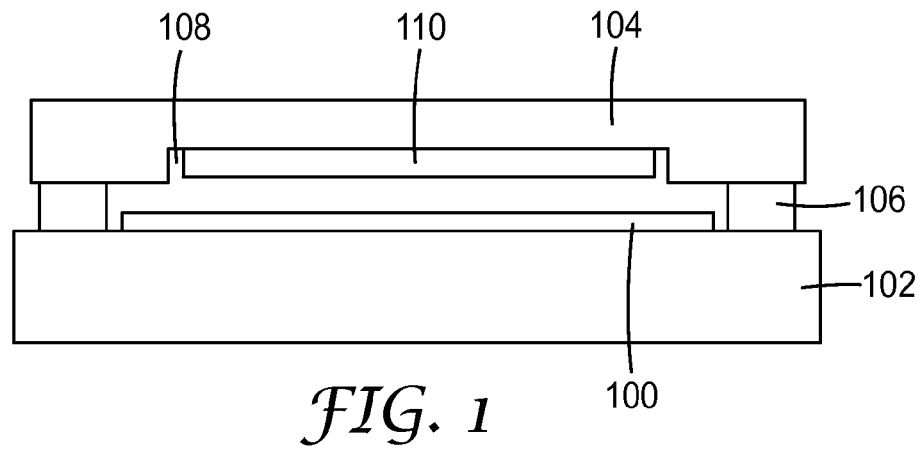
FIG. 1 illustrates a conventional OLED encapsulation using a schematic side view.
Figure 2:
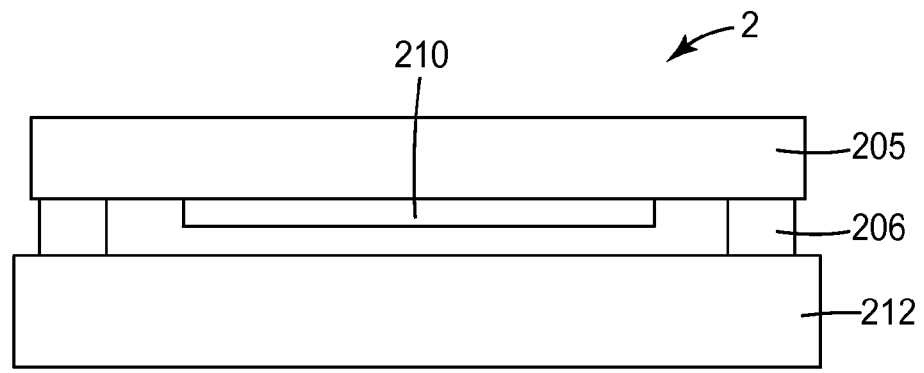
FIG. 2 illustrates a flexible encapsulating film system of the invention using a schematic side view.
Figure 3:
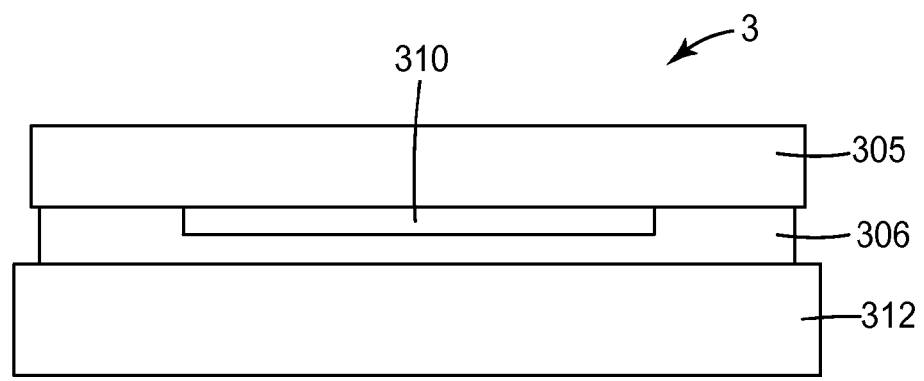
FIG. 3 illustrates another flexible encapsulating film system of the invention using a schematic side view.

FIG. 2 illustrates an embodiment of a flexible encapsulating film system of the invention. Flexible encapsulating film system 2 includes a flexible barrier film 205 with desiccant 210 on a portion of the flexible barrier film 205. The periphery of the desiccant area is surrounded by adhesive 206. The adhesive 206 is patterned such that it will form an adhesive "gasket" around the desiccant 210 when the flexible encapsulating system 2 is adhered to a substrate. (Alternatively, as shown in flexible encapsulating film system 3 in FIG. 3, the adhesive 306 can completely cover the desiccant 310.) A release liner 212 protects the adhesive. The release liner 212 can be removed prior to bonding the flexible encapsulating film system 2 to an OED substrate.

Figure 4:
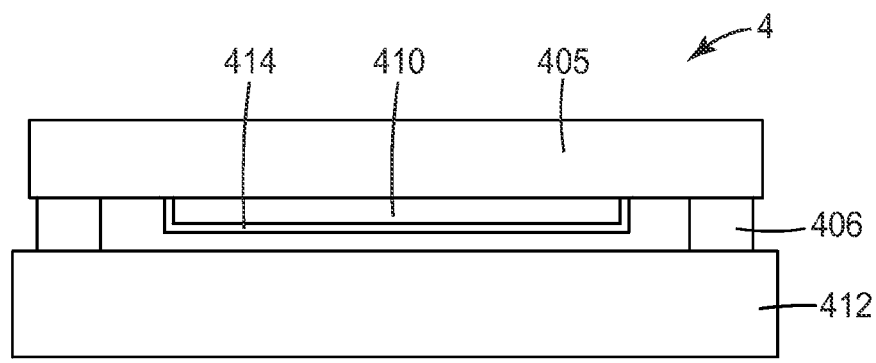
FIG. 4 illustrates a flexible encapsulating film system of the invention including an optional protective layer using a schematic side view.

FIG. 4 illustrates another embodiment of a flexible encapsulating film system of the invention. Flexible encapsulating film system 4 is similar to flexible encapsulating film system 2, but it includes a protective layer 414 on the desiccant 410.

Figure 5:
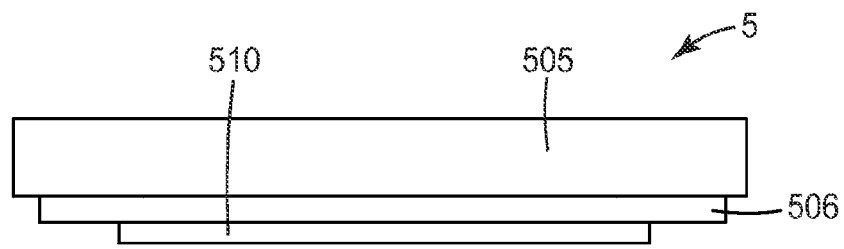
FIG. 5 illustrates yet another flexible encapsulating film system of the invention using a schematic side view.

FIG. 5 illustrates yet another embodiment of a flexible encapsulating film system of the invention. In flexible encapsulating film system 5, the adhesive 506 is on a portion of the flexible barrier film 505, and the desiccant 510 is on a portion of the adhesive 506. Optionally, the flexible encapsulating film system 5 can comprise a release liner (not shown) to protect the adhesive and desiccant.

Flexible Barrier Film

The flexible barrier film used in the flexible encapsulating film systems of the invention can be selected from a variety of useful constructions. In general, the films are selected such that they have oxygen and water transmission rates at a specified level as required by the electronic device application. Preferably, the flexible barrier film has a water vapor transmission rate (WVTR) less than about 0.005 g/m$^2$/day at 38° C. and 100% relative humidity; more preferably, less than about 0.0005 g/m$^2$/day at 38° C. and 100% relative humidity; most preferably, less than about 0.00005 g/m$^2$/day at 38° C. and 100% relative humidity. In some embodiments, the flexible barrier film has a WVTR of less than about 0.005 g/m$^2$/day at 50° C. and 100% relative humidity or even less than about 0.005 g/m$^2$/day at 85° C. and 100% relative humidity.

Useful flexible barrier films include, for example, inorganic films prepared by atomic layer deposition, thermal evaporation, sputtering, chemical vapor deposition, and the like. The films can be transparent or opaque depending upon the type of OED to be encapsulated and the intended end use of the OED.

Inorganic/Organic Multilayer Films

Some useful flexible barrier films comprise inorganic/organic multilayers. Flexible ultra-barrier films comprising inorganic/organic multilayers are described, for example, in U.S. Pat. No. 7,018,713 (Padiyath et al.). Such flexible ultra-barrier films typically include a flexible support overcoated with a first polymer layer and further overcoated with two or more inorganic barrier layers separated by at least one second polymer layer. The flexible ultra-barrier film can have an oxygen transmission rate less than about 0.005 cc/m$^2$/day at 23° C. and 90% relative humidity (RH).

Useful support materials include organic polymeric materials such as polyethyleneterephthalate (PET), polyacrylates, polycarbonate, silicone, epoxy resins, silicone-functionalized epoxy resins, polyester such as Mylar (made by E. I. du Pont de Nemours & Co.), polyimide such as Kapton H or Kapton E (made by du Pont), Apical AV (made by Kanegafugi Chemical Industry Company), Upilex (made by UBE Industries, Ltd.), polyethersulfones (PES, made by Sumitomo), polyetherimide such as Ultem (made by General Electric Company), polyethylenenaphthalene (PEN), polyethylene, and polypropylene.

The support can be made of a flexible plastic film having a glass transition temperature (Tg) greater than or equal to that of heat stabilized polyethylene terephthalate (HSPET, Tg=about 78° C.) (wherein Tg is determined using differential scanning calorimetry (DSC)). Preferably, the support is heat-stabilized using heat setting annealing under tension or other techniques that will discourage shrinkage up to at least the heat stabilization temperature when the support is not constrained. If the support has not been heat stabilized, then it preferably has a Tg greater than that of polymethyl methacrylate (PMMA, Tg=105° C.). More preferably the support has a Tg of at least about 110° C., even more preferably at least about 120° C., and most preferably at least about 128° C. In addition to HSPET, preferred supports include other heat-stabilized high Tg polyesters, PMMA, styrene/acrylonitrile (SAN, Tg=110° C.), styrene/maleic anhydride (SMA, Tg=115° C.), polyethylene naphthalate (PEN, Tg=about 120° C.), polyoxymethylene (POM, Tg=about 125° C.), polyvinylnaphthalene (PVN, Tg=about 135° C.), polyetheretherketone (PEEK, Tg=about 145° C.), polyaryletherketone (PAEK, Tg=145° C.), high Tg fluoropolymers (for example, DYNEON™ HTE terpolymer of hexafluoropropylene, tetrafluoroethylene, and ethylene, Tg=about 149° C.), polycarbonate (PC, Tg=about 150° C.), poly α-methyl styrene (Tg=about 175° C.), polyarylate (PAR, Tg=190° C.), polysulfone (PSul, Tg=about 195° C.), polyphenylene oxide (PPO, Tg=about 200° C.), polyetherimide (PEI, Tg=about 218° C.), polyarylsulfone (PAS, Tg=220° C.), poly ether sulfone (PES, Tg=about 225° C.), polyamideimide (PAI, Tg=about 275° C.), polyimide (Tg=about 300° C.) and polyphthalamide (heat deflection temp of 120° C.).

For applications where material costs are important, supports made of PET, PEN, HSPET and heat stabilized PEN are preferred; PET and PEN are most preferred. For applications where barrier performance is paramount, supports made of more expensive materials may be employed. Preferably the support has a thickness of about 0.01 to about 1 mm, more preferably about 0.05 to about 0.25 mm. The support can be light-transmissive. In some embodiments, the support can have a visible light transmission of at least about 70% at 550 nm.

The first polymer layer can be formed by applying a layer of a monomer or oligomer to the substrate and crosslinking the layer to form the polymer in situ, for example, by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the support. The monomer or oligomer can also be applied to the substrate using conventional coating methods such as roll coating (for example, gravure roll coating) or spray coating (for example, electrostatic spray coating), then crosslinked as set out above. The first polymer layer can also be formed by applying a layer containing an oligomer or polymer in solvent and drying the thus-applied layer to remove the solvent. Plasma polymerization may also be employed if it will provide a polymeric layer having a glassy state at an elevated temperature, with a glass transition temperature greater than or equal to that of HSPET. Most preferably, the first polymer layer is formed by flash evaporation and vapor deposition followed by crosslinking in situ, for example, as described in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis); in published PCT Application No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).

The smoothness and continuity of each polymer layer and its adhesion to the underlying layer can be enhanced by appropriate pretreatment. A preferred pretreatment regimen employs an electrical discharge in the presence of a suitable reactive or non-reactive atmosphere (for example, plasma, glow discharge, corona discharge, dielectric barrier discharge or atmospheric pressure discharge); chemical pretreatment or flame pretreatment. A separate adhesion promotion layer which may have a different composition than the high Tg polymer layer may also be utilized atop an underlying layer to improve interlayer adhesion. The adhesion promotion layer can be, for example, a separate polymeric layer or a metal-containing layer such as a layer of metal, metal oxide, metal nitride or metal oxynitride. The adhesion promotion layer may have a thickness of a few nm (for example, 1 or 2 nm) to about 50 nm, and can be thicker if desired.

The desired chemical composition and thickness of the first polymer layer will depend in part on the nature and surface topography of the support. The thickness preferably is sufficient to provide a smooth, defect-free surface to which the subsequent first inorganic barrier layer can be applied. For example, the first polymer layer may have a thickness of a few nm (for example, 2 or 3 nm) to about 5 micrometers, and can be thicker if desired.

At least two inorganic barrier layers separated by a polymer layer (preferably having a Tg greater than or equal to that of HSPET) typically lie atop the first polymer layer (although in some embodiments, only one inorganic barrier layer is utilized). These layers can respectively be referred to as the "first inorganic barrier layer", "second inorganic barrier layer" and "second polymer layer". In some embodiments it is preferred that these inorganic barrier layers are visible light transmissive. Additional inorganic barrier layers and polymer layers can be present if desired, including polymer layers that do not have a Tg greater than or equal to that of HSPET. Preferably however each neighboring pair of inorganic barrier layers is separated only by a polymer layer or layers having a Tg greater than or equal to that of HSPET, and more preferably only by a polymer layer or layers having a Tg greater than that of PMMA.

The inorganic barrier layers do not have to be the same. A variety of inorganic barrier materials can be employed. Preferred inorganic barrier materials include metals, metal oxides, metal nitrides, metal carbides, metal oxynitrides, metal oxyborides, and combinations thereof, for example, silicon oxides such as silica, aluminum oxides such as alumina, titanium oxides such as titania, indium oxides, tin oxides, indium tin oxide (ITO), tantalum oxide, zirconium oxide, niobium oxide, boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. Indium tin oxide, silicon oxide, aluminum oxide and combinations thereof are especially preferred inorganic barrier materials. ITO is an example of a special class of ceramic materials that can become electrically conducting with the proper selection of the relative proportions of each elemental constituent. The inorganic barrier layers preferably are formed using techniques employed in the film metallizing art such as sputtering (for example, cathode or planar magnetron sputtering, dual AC planar magnetron sputtering or dual AC rotatable magnetron sputtering), evaporation (for example, resistive or electron beam evaporation and energy enhanced analogs of resistive or electron beam evaporation including ion beam and plasma assisted deposition), chemical vapor deposition, plasma-enhanced chemical vapor deposition, plating and the like. Most preferably the inorganic barrier layers are formed using sputtering, for example, reactive sputtering. Enhanced barrier properties have been observed when the inorganic layer is formed by a high energy deposition technique such as sputtering compared to lower energy techniques such as conventional vapor deposition processes. Without being bound by theory, it is believed that the enhanced properties are due to the condensing species arriving at the substrate with greater kinetic energy, leading to a lower void fraction as a result of compaction. The smoothness and continuity of each inorganic barrier layer and its adhesion to the underlying layer can be enhanced by pretreatments (for example, plasma pretreatment) such as those described above with reference to the first polymer layer.

The inorganic barrier layers do not have to have the same thickness. The desired chemical composition and thickness of each inorganic barrier layer will depend in part on the nature and surface topography of the underlying layer and on the desired optical properties for the barrier assembly. The inorganic barrier layers preferably are sufficiently thick so as to be continuous, and sufficiently thin so as to ensure that the barrier assembly and articles containing the assembly will have the desired degree of visible light transmission and flexibility. Preferably the physical thickness (as opposed to the optical thickness) of each inorganic barrier layer is about 3 to about 150 nm, more preferably about 4 to about 75 nm.

The second polymer layers that separate the first, second and any additional inorganic barrier layers do not have to be the same, and do not all have to have the same thickness. A variety of second polymer layer materials can be employed. Preferred second polymer layer materials include those mentioned above with respect to the first polymer layer. Preferably the second polymer layer or layers are applied by flash evaporation and vapor deposition followed by crosslinking in situ as described above with respect to the first polymer layer. A pretreatment such as those described above (for example, plasma pretreatment) preferably also is employed prior to formation of a second polymer layer. The desired chemical composition and thickness of the second polymer layer or layers will depend in part on the nature and surface topography of the underlying layer(s). The second polymer layer thickness preferably is sufficient to provide a smooth, defect-free surface to which a subsequent inorganic barrier layer can be applied. Typically the second polymer layer or layers may have a lower thickness than the first polymer layer. For example, each second polymer layer may have a thickness of about 5 nm to about 10 micrometers, and can be thicker if desired.

In some embodiments, the barrier assemblies have a protective polymer topcoat. This topcoat can be referred to as the "third polymer layer". Volatilizable (meth)acrylate monomers are preferred for use in the third polymer layer, with volatilizable acrylate monomers having a Tg greater than or equal to that of HSPET being especially preferred (for example, those mentioned above with respect to the first and second polymer layers) and volatilizable acrylate monomers having a Tg greater than PMMA being most preferred. If desired, the third polymer layer can be applied using conventional coating methods such as roll coating (for example, gravure roll coating) or spray coating (for example, electrostatic spray coating), then crosslinked using, for example, UV radiation. Most preferably the third polymer layer is formed by flash evaporation, vapor deposition and crosslinking of a monomer as described above with respect to the first and second polymer layers. A pretreatment such as those described above (for example, plasma pretreatment) preferably also is employed prior to formation of the third polymer layer. The desired chemical composition and thickness of the third polymer layer will depend in part on the nature and surface topography of the underlying layer(s), the hazards to which the barrier assembly might be exposed, and applicable device requirements. The third polymer layer thickness preferably is sufficient to provide a smooth, defect-free surface that will protect the underlying layers from ordinary hazards. Typically the third polymer layer may have a lower thickness than the first polymer layer and a greater thickness than the second polymer layer or layers. For example, the third polymer layer may have a thickness of about 5 nm to about 10 micrometers, and can be thicker if desired.

Barrier assemblies have a sufficient number of inorganic barrier layers and the substrate and first and second polymer layers preferably have a sufficiently high Tg so that the barrier assembly will have sufficient barrier properties for their desired application. For certain applications, visible light transparency values (Tvis, determined by averaging the percent transmission T between 400 nm and 700 nm) of at least about 20%, more preferably at least about 60% are preferred.

Multilayer Films with Graded Compositions

Other useful flexible barrier films comprise films having a graded-composition barrier coating such as those described in U.S. Pat. No. 7,015,640 (Schaepkens et al.).

Films having a graded-composition barrier coating can be made by depositing reaction or recombination products of reacting species onto a substrate or film. Varying the relative supply rates or changing the identities of the reacting species results in a coating that has a graded composition across its thickness.

Useful substrate materials include organic polymeric materials such as polyethyleneterephthalate (PET), polyacrylates, polycarbonate, silicone, epoxy resins, silicone-functionalized epoxy resins, polyester such as Mylar (made by E. I. du Pont de Nemours & Co.), polyimide such as Kapton H or Kapton E (made by du Pont), Apical AV (made by Kanegafugi Chemical Industry Company), Upilex (made by UBE Industries, Ltd.), polyethersulfones (PES, made by Sumitomo), polyetherimide such as Ultem (made by General Electric Company), polyethylenenaphthalene (PEN), polyethylene, and polypropylene.

Suitable coating compositions of regions across the thickness are organic, inorganic, or ceramic materials. These materials are typically reaction or recombination products of reacting plasma species and are deposited onto the substrate surface. Organic coating materials typically comprise carbon, hydrogen, oxygen, and optionally other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, aromatics, etc., having up to 15 carbon atoms. Inorganic and ceramic coating materials typically comprise oxide; nitride; carbide; boride; or combinations thereof of elements of Groups IIA, IIIA, IVA, VA, VIA, VIIA, IB, and IIB; metals of Groups IIIB, IVB, and VB; and rare-earth metals. For example, silicon carbide can be deposited onto a substrate by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum tartrate and ammonia. Other combinations of reactants may be chosen to obtain a desired coating composition. The choice of the particular reactants is within the skills of the artisans. A graded composition of the coating can be obtained by changing the compositions of the reactants fed into the reactor chamber during the deposition of reaction products to form the coating or by using overlapping deposition zones, for example, in a web process.

Coating thickness is typically in the range from about 10 nm to about 10000 nm, preferably from about 10 nm to about 1000 nm, and more preferably from about 10 nm to about 200 nm. It may be desired to choose a coating thickness that does not impede the transmission of light through the substrate, such as a reduction in light transmission being less than about 20 percent, preferably less than about 10 percent, and more preferably less than about 5 percent. The coating may be formed by one of many deposition techniques, such as plasma-enhanced chemical-vapor deposition (PECVD), radio-frequency plasma-enhanced chemical-vapor deposition (RFPECVD), expanding thermal-plasma chemical-vapor deposition (ETPCVD), sputtering including reactive sputtering, electron-cyclotron-resonance plasma-enhanced chemical-vapor deposition (ECRPECVD), inductively coupled plasma-enhanced chemical-vapor deposition (ICPECVD), or combinations thereof.

Multilayer Films Containing Diamond-Like Layers

Still other useful flexible barrier films comprise plasma polymer layers (for example, diamond-like films) such as those disclosed in U.S. Patent App. Pub. No. 2007-0020451. Flexible barrier films can be made from assemblies including a substrate, a first polymer layer overcoated on the substrate, and a second polymer layer overcoated on the first polymer layer. In this assembly, the first polymer layer is composed of a first polymer and the second polymer layer is composed of a second polymer different from the first polymer, and the second polymer comprises a plasma polymer. Such composite assemblies can include, for example, a substrate, a polymer layer overcoated on the substrate, and a diamond-like carbon layer or a diamond-like glass overcoated on the polymer layer.

The term "overcoated" to describe the position of a layer with respect to a substrate or other element of a barrier assembly, refers to the layer as being atop the substrate or other element, but not necessarily contiguous to either the substrate or the other element.

The term "diamond-like glass" (DLG) refers to substantially or completely amorphous glass including carbon and silicon, and optionally including one or more additional components selected from the group including hydrogen, nitrogen, oxygen, fluorine, sulfur, titanium, and copper. Other elements may be present in certain embodiments. The amorphous diamond-like glass films may contain clustering of atoms to give it a short-range order but are essentially void of medium and long range ordering that lead to micro or macro crystallinity which can adversely scatter radiation having wavelengths of from 180 nanometers (nm) to 800 nm.

The term "diamond-like carbon" (DLC) refers to an amorphous film or coating comprising approximately 50 to 90 atomic percent carbon and approximately 10 to 50 atomic percent hydrogen, with a gram atom density of between approximately 0.20 and approximately 0.28 gram atoms per cubic centimeter, and composed of approximately 50% to approximately 90% tetrahedral bonds.

The barrier assemblies can have multiple layers made from alternating DLG or DLC layers and polymer layers protecting an underlying substrate. Each group of different polymers, or combinations of polymers including DLG or DLC, are referred to as a dyad, and the assembly can include any number of dyads. It can also include various types of optional layers between the dyads. Assemblies can include any number of alternating or other layers. Adding more layers may increase their imperviousness to oxygen, moisture, or other contaminants. Use of more or multiple layers may also help cover or encapsulate defects within the layers.

The substrate can also be curved or flexible, for example by using plastics or other materials. The substrate can be of any desired shape. Particularly preferred supports are flexible plastic materials including thermoplastic films such as polyesters (for example, PET), polyacrylates (for example, polymethyl methacrylate), polycarbonates, polypropylenes, high or low density polyethylenes, polyethylene naphthalates, polysulfones, polyether sulfones, polyurethanes, polyamides, polyvinyl butyral, polyvinyl chloride, polyvinylidene difluoride and polyethylene sulfide, and thermoset films such as cellulose derivatives, polyimide, polyimide benzoxazole, and poly benzoxazole.

Other suitable materials for the substrate include chlorotrifluoroethylene-vinylidene fluoride copolymer (CTFE/VDF), ethylene-chlorotrifluoroethylene copolymer (ECTFE), ethylene-tetrafluoroethylene copolymer (ETFE), fluorinated ethylene-propylene copolymer (FEP), polychlorotrifluoroethylene (PCTFE), perfluoroalkyl-tetrafluoroethylene copolymer (PFA), polytetrafluoroethyloene (PTFE), polyvinylidene fluoride (PVDF), polyvinyl fluoride (PVF), tetrafluoroethylene-hexafluoropropylene copolymer (TFE/HFP), tetrafluoroethylene-hexafluoropropylene-vinylidene fluoride terpolymer (THV), polychlorotrifluoroethylene (PCTFE), hexafluoropropylene-vinylidene fluoride copolymer (HFP/VDF), tetrafluoroethylene-propylene copolymer (TFE/P), and tetrafluoroethylene-perfluoromethylether copolymer (TFE/PFMe).

Alternative substrates include materials having a high glass transition temperature (Tg) barrier, preferably being heat-stabilized, using heat setting, annealing under tension, or other techniques that will discourage shrinkage up to at least the heat stabilization temperature when the support is not constrained. If the support has not been heat stabilized, then it preferably has a Tg greater than that of polymethyl methacrylate (PMMA, Tg=105° C.). More preferably the support has a Tg of at least about 110° C., yet more preferably at least about 120° C., and most preferably at least about 128° C. In addition to heat-stabilized polyethylene terephthalate (HSPET), other preferred supports include other heat-stabilized high Tg polyesters, PMMA, styrene/acrylonitrile (SAN, Tg=110° C.), styrene/maleic anhydride (SMA, Tg=115° C.), polyethylene naphthalate (PEN, Tg=about 120° C.), polyoxymethylene (POM, Tg=about 125° C.), polyvinylnaphthalene (PVN, Tg=about 135° C.), polyetheretherketone (PEEK, Tg=about 145° C.), polyaryletherketone (PAEK, Tg=145° C.), high Tg fluoropolymers (for example, DYNEON™ HTE terpolymer of hexafluoropropylene, tetrafluoroethylene, and ethylene, Tg=about 149° C.), polycarbonate (PC, Tg=about 150° C.), poly alpha-methyl styrene (Tg=about 175° C.), polyarylate (PAR, Tg=190° C.), polysulfone (PSul, Tg=about 195° C.), polyphenylene oxide (PPO, Tg=about 200° C.), polyetherimide (PEI, Tg=about 218° C.), polyarylsulfone (PAS, Tg=220° C.), poly ether sulfone (PES, Tg=about 225° C.), polyamide-imide (PAI, Tg=about 275° C.), polyimide (Tg=about 300° C.) and polyphthalamide (heat deflection temp of 120° C.). Preferably the substrate has a thickness of about 0.01 millimeters (mm) to about 1 mm, more preferably about 0.05 mm to about 0.25 mm.

Diamond-like glass is an amorphous carbon system including a substantial quantity of silicon and oxygen that exhibits diamond-like properties. In these films, on a hydrogen-free basis, there is at least 30% carbon, a substantial amount of silicon (typically at least 25%) and no more than 45% oxygen. The unique combination of a fairly high amount of silicon with a significant amount of oxygen and a substantial amount of carbon makes these films highly transparent and flexible (unlike glass).

Diamond-like glass thin films may have a variety of light transmissive properties. Depending upon the composition, the thin films may have increased transmissive properties at various frequencies. However, in specific implementations, the thin film (when approximately one micron thick) is at least 70% transmissive to radiation at substantially all wavelengths from about 250 nm to about 800 nm and more preferably from about 400 nm to about 800 nm. The extinction coefficient of DLG film is as follows: 70% transmission for a one micron thick film corresponds to an extinction coefficient (k) of less than 0.02 in the visible wavelength range between 400 nm and 800 nm.

In creating a diamond-like glass film, various additional components can be incorporated into the basic carbon or carbon and hydrogen composition. These additional components can be used to alter and enhance the properties that the diamond-like glass film imparts to the substrate. For example, it may be desirable to further enhance the barrier and surface properties.

The additional components may include one or more of hydrogen (if not already incorporated), nitrogen, fluorine, sulfur, titanium, or copper. Other additional components may also be of benefit. The addition of hydrogen promotes the formation of tetrahedral bonds. The addition of fluorine is particularly useful in enhancing barrier and surface properties of the diamond-like glass film, including the ability to be dispersed in an incompatible matrix. The addition of nitrogen may be used to enhance resistance to oxidation and to increase electrical conductivity. The addition of sulfur can enhance adhesion. The addition of titanium tends to enhance adhesion as well as diffusion and barrier properties.

These diamond-like materials may be considered as a form of plasma polymers, which can be deposited on the assembly using, for example, a vapor source. The term "plasma polymer" is applied to a class of materials synthesized from a plasma by using precursor monomers in the gas phase at low temperatures. Precursor molecules are broken down by energetic electrons present in the plasma to form free radical species. These free radical species react at the substrate surface and lead to polymeric thin film growth. Due to the non-specificity of the reaction processes in both the gas phase and the substrate, the resulting polymer films are highly cross-linked and amorphous in nature. This class of materials has been researched and summarized in publications such as the following: H. Yasuda, "Plasma Polymerization," Academic Press Inc., New York (1985); R.d'Agostino (Ed), "Plasma Deposition, Treatment & Etching of Polymers," Academic Press, New York (1990); and H. Biederman and Y. Osada, "Plasma Polymerization Processes," Elsever, New York (1992).

Typically, these polymers have an organic nature to them due to the presence of hydrocarbon and carbonaceous functional groups such as $CH_3$, $CH_2$, CH, Si—C, Si—$CH_3$, Al—C, Si—O—$CH_3$, etc.

Not all plasma deposition processes lead to plasma polymers. Inorganic thin films are frequently deposited by PECVD at elevated substrate temperatures to produce thin inorganic films such as amorphous silicon, silicon oxide, silicon nitride, aluminum nitride, etc. Lower temperature processes may be used with inorganic precursors such as silane ($SiH_4$) and ammonia ($NH_3$). In some cases, the organic component present in the precursors is removed in the plasma by feeding the precursor mixture with an excess flow of oxygen. Silicon rich films are produced frequently from tetramethyldisiloxane (TMDSO)-oxygen mixtures where the oxygen flow rate is ten times that of the TMDSO flow. Films produced in these cases have an oxygen to silicon ratio of about 2, which is near that of silicon dioxide.

Plasma polymer films described herein are substantially sub-stoichiometric in their inorganic component and substantially carbon-rich, depicting their organic nature. In films containing silicon, for example, the oxygen to silicon ratio is preferably below 1.8 (silicon dioxide has a ratio of 2.0), and most preferably below 1.5 as in the case of DLG, and the carbon content is at least about 10%. Preferably, the carbon content is at least about 20% and most preferably at least about 25%.

DLC coatings contain substantially two types of carbon—carbon bonds: trigonal graphite bonds ($sp^2$) and tetrahedral diamond bonds ($sp^3$). DLC is composed of approximately 50% to 90% tetrahedral bonds. The crystallinity and the nature of the bonding of the carbon determine the physical and chemical properties of the coating. DLC is a non-crystalline amorphous material. DLC contains a substantial amount of hydrogen (from 10 to 50 atomic percent).

Various additives to the DLC coating can be used. These additives may comprise one or more of nitrogen, oxygen, fluorine, or silicon. The addition of fluorine is particularly useful in enhancing barrier and surface properties, including dispersibility, of the DLC coating. Sources of fluorine include compounds such as carbon tetrafluoride ($CF_4$), sulfur hexafluoride ($SF_6$), $C_2F_6$, $C_3F_8$, and $C_4F_{10}$. The addition of silicon and oxygen to the DLC coating tend to improve the optical transparency and thermal stability of the coating. The addition of nitrogen may be used to enhance resistance to oxidation and to increase electrical conductivity. Sources of oxygen include oxygen gas ($O_2$), water vapor, ethanol, and hydrogen peroxide. Sources of silicon preferably include silanes such as $SiH_4$, $Si_2H_6$, and hexamethyldisiloxane. Sources of nitrogen include nitrogen gas ($N_2$), ammonia ($NH_3$), and hydrazine ($N_2H_6$).

The additives may be incorporated into the diamond-like matrix or attached to the surface atomic layer. If the additives are incorporated into the diamond-like matrix they may cause perturbations in the density and/or structure, but the resulting material is essentially a densely packed network with diamond-like carbon characteristics (chemical inertness, hardness, barrier properties, etc.). If the additive concentration is large, greater than 50 atomic percent relative to the carbon concentration, the density will be affected and the beneficial properties of the diamond-like carbon network will be lost. If the additives are attached to the surface atomic layers they will alter only the surface structure and properties. The bulk properties of the diamond-like carbon network will be preserved.

The polymer layers used in the multilayer stack of the barrier assemblies are preferably crosslinkable. The crosslinked polymeric layer lies atop the substrate or other layers, and it can be formed from a variety of materials. Preferably the polymeric layer is crosslinked in situ atop the underlying layer. If desired, the polymeric layer can be applied using conventional coating methods such as roll coating (for example, gravure roll coating) or spray coating (for example, electrostatic spray coating), then crosslinked using, for example, ultraviolet (UV) radiation. Most preferably the polymeric layer is formed by flash evaporation, vapor deposition and crosslinking of a monomer as described above. Volatilizable (meth)acrylate monomers are preferred for use in such a process, with volatilizable acrylate monomers being especially preferred. Preferred (meth)acrylates have a molecular weight in the range of about 150 to about 600, more preferably about 200 to about 400. Other preferred (meth) acrylates have a value of the ratio of the molecular weight to the number of acrylate functional groups per molecule in the range of about 150 to about 600 g/mole/(meth)acrylate group, more preferably about 200 to about 400 g/mole/(meth)acrylate group. Fluorinated (meth)acrylates can be used at higher molecular weight ranges or ratios, for example, about 400 to about 3000 molecular weight or about 400 to about 3000 g/mole/(meth)acrylate group. Coating efficiency can be improved by cooling the support. Particularly preferred monomers include multifunctional (meth)acrylates, used alone or in combination with other multifunctional or monofunctional (meth)acrylates, such as hexanediol diacrylate, ethoxyethyl acrylate, phenoxyethyl acrylate, cyanoethyl (mono)acrylate, isobornyl acrylate, isobornyl methacrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2, 2-trifluoromethyl (meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, tris(2-hydroxyethyl)isocyanurate triacrylate, pentaerythritol triacrylate, phenylthioethyl acrylate, naphthloxyethyl acrylate, cyclic diacrylates (for example, EB-130 from Cytec Industries Inc. and tricyclodecane dimethanol diacrylate, available as SR833S from Sartomer Co.), epoxy acrylate RDX80095 from Cytec Industries Inc., and mixtures thereof. A variety of other curable materials can be included in the crosslinked polymeric layer, for example, vinyl ethers, vinyl naphthylene, acrylonitrile, and mixtures thereof.

Alternative materials for the polymer layers include materials having a Tg greater than or equal to that of HSPET. A variety of alternative polymer materials can be employed. Volatilizable monomers that form suitably high Tg polymers are especially preferred. Preferably the alternative polymer layer has a Tg greater than that of PMMA, more preferably a Tg of at least about 110° C., yet more preferably at least about 150° C., and most preferably at least about 200° C. Especially preferred monomers that can be used to form this layer include urethane acrylates (for example, CN-968, Tg=about 84° C. and CN-983, Tg=about 90° C., both commercially available from Sartomer Co.), isobornyl acrylate (for example, SR-506, commercially available from Sartomer Co., Tg=about 88° C.), dipentaerythritol pentaacrylates (for example, SR-399, commercially available from Sartomer Co., Tg=about 90° C.), epoxy acrylates blended with styrene (for example, CN-120S80, commercially available from Sartomer Co., Tg=about 95° C.), di-trimethylolpropane tetraacrylates (for example, SR-355, commercially available from Sartomer Co., Tg=about 98° C.), diethylene glycol diacrylates (for example, SR-230, commercially available from Sartomer Co., Tg=about 100° C.), 1,3-butylene glycol diacrylate (for example, SR-212, commercially available from Sartomer Co., Tg=about 101° C.), pentaacrylate esters (for example, SR-9041, commercially available from Sartomer Co., Tg=about 102° C.), pentaerythritol tetraacrylates (for example, SR-295, commercially available from Sartomer Co., Tg=about 103° C.), pentaerythritol triacrylates (for example, SR-444, commercially available from Sartomer Co., Tg=about 103° C.), ethoxylated (3) trimethylolpropane triacrylates (for example, SR-454, commercially available from Sartomer Co., Tg=about 103° C.), ethoxylated (3) trimethylolpropane triacrylates (for example, SR-454HP, commercially available from Sartomer Co., Tg=about 103° C.), alkoxylated trifunctional acrylate esters (for example, SR-9008, commercially available from Sartomer Co., Tg=about 103° C.), dipropylene glycol diacrylates (for example, SR-508, commercially available from Sartomer Co., Tg=about 104° C.), neopentyl glycol diacrylates (for example, SR-247, commercially available from Sartomer Co., Tg=about 107° C.), ethoxylated (4) bisphenol a dimethacrylates (for example, CD-450, commercially available from Sartomer Co., Tg=about 108° C.), cyclohexane dimethanol diacrylate esters (for example, CD-406, commercially available from Sartomer Co., Tg=about 110° C.), isobornyl methacrylate (for example, SR-423, commercially available from Sartomer Co., Tg=about 110° C.), cyclic diacrylates (for example, EB-130, commercially available from Cytec Industries Inc., Tg=about 208° C.) and tris(2-hydroxy ethyl)isocyanurate triacrylate (for example, SR-368, commercially available from Sartomer Co., Tg=about 272° C.), acrylates of the foregoing methacrylates and methacrylates of the foregoing acrylates.

Optional layers include one or more inorganic barrier layers. The inorganic barrier layers, when multiple such layers are used, do not have to be the same. A variety of inorganic barrier materials can be employed. Preferred inorganic barrier materials include metals, metal oxides, metal nitrides, metal carbides, metal oxynitrides, metal oxyborides, and combinations thereof, for example, silicon oxides such as silica, aluminum oxides such as alumina, titanium oxides such as titania, indium oxides, tin oxides, indium tin oxide (ITO), tantalum oxide, zirconium oxide, niobium oxide, boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. Indium tin oxide, silicon oxide, aluminum oxide and combinations thereof are especially preferred inorganic barrier materials. ITO is an example of a special class of ceramic materials that can become electrically conducting with the proper selection of the relative proportions of each elemental constituent. The inorganic barrier layers, when incorporated into the assembly, preferably are formed using techniques employed in the film metallizing art such as sputtering (for example, cathode or planar magnetron sputtering), evaporation (for example, resistive or electron beam evaporation), chemical vapor deposition, plating and the like. Most preferably the inorganic barrier layers are formed using sputtering, for example, reactive sputtering. The smoothness and continuity of each inorganic barrier layer and its adhesion to the underlying layer can be enhanced by pretreatments (for example, plasma pretreatment).

The polymer layers can be formed by applying a layer of a monomer or oligomer to the substrate and crosslinking the layer to form the polymer in situ, for example, by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the support. The monomer or oligomer can also be applied to the substrate using conventional coating methods such as roll coating (for example, gravure roll coating) or spray coating (for example, electrostatic spray coating), then crosslinked. The polymer layers can also be formed by applying a layer containing an oligomer or polymer in solvent and drying the thus-applied layer to remove the solvent. Plasma polymerization may also be employed if it will provide a polymeric layer having a glassy state at an elevated temperature, with a glass transition temperature greater than or equal to that of HSPET. Most preferably, the polymer layers are formed by flash evaporation and vapor deposition followed by crosslinking in situ, for example, as described in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis), U.S. Pat. No. 7,015,640 (Schaepkens et al.); in published PCT Application No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).

Amorphous diamond-like films formed via ion enhanced plasma chemical vapor deposition (PECVD) utilizing silicone oil and an optional silane source to form the plasma as described, for example, in U.S. Patent Application Pub. No. 2008/0196664, can also be useful.

The term "amorphous diamond-like film" refers to substantially (that is, greater than about 5%) or completely amorphous glass including silicone, and optionally including one or more additional components selected from the group including carbon, hydrogen, nitrogen, oxygen, fluorine, sulfur, titanium, and copper. Other elements may be present in certain embodiments. The amorphous diamond-like films may contain clustering of atoms to give it a short-range order but are essentially void of medium and long range ordering that lead to micro or macro crystallinity which can adversely scatter radiation having wavelengths of from 180 nanometers (nm) to 800 nm.

Silicone, silicone oil, or siloxanes are used interchangeably and refer to oligomeric and higher molecular weight molecules having a structural unit $R_2SiO$ in which R is independently selected from hydrogen, $(C_1-C_8)$alkyl, $(C_5-C_{18})$aryl, $(C_6-C_{26})$arylalkyl, or $(C_6-C_{26})$alkylaryl. These can also be referred to as polyorganosiloxanes and include chains of alternating silicon and oxygen atoms (—O—Si—O—Si—O—) with the free valences of the silicon atoms joined usually to R groups, but may also be joined (crosslinked) to oxygen atoms and silicon atoms of a second chain, forming an extended network (high MW).

The amorphous diamond-like film layers or coatings are deposited on an electrode powered using an RF source operating at least 0.1 W/cm$^2$ of forward power. The vacuum chamber is configured such that these operating conditions result in a very high (>500 V) negative potential on the electrode. As a result of ion bombardment from having high substrate bias (for example, ion enhanced), the coating formed has very low free volume. The electrode can be water cooled, as desired. In many embodiments, a siloxane source such as vaporized silicone oil is introduced in quantities such that the resulting plasma formed coatings are flexible. These coatings have high optical transmission. Any additional useful process gases, such as oxygen, nitrogen and/or ammonia for example, can be used with the siloxane and optional silane to assist in maintaining the plasma and to modify the properties of the amorphous diamond-like film layers or coatings. Combinations of additional process gases can be employed, as desired.

In some embodiments, the amorphous diamond-like film, layer, or coating is deposited onto one or both sides of a flexible film. The flexible film can be formed of any useful material such as polymeric and/or metallic materials. The amorphous diamond-like film can be any useful thickness. In many embodiments, the an amorphous diamond-like film can have a thickness of greater than 500 Angstroms, or greater than 1,000 Angstroms. In many embodiments, the an amorphous diamond-like film can have a thickness in a range from 1,000 to 50,000 Angstroms, or from 1,000 to 25,000 Angstroms, or from 1,000 to 10,000 Angstroms.

In some embodiments, the an amorphous diamond-like film includes one or more amorphous diamond-like film layers or an amorphous diamond-like film layer formed by changing or pulsing the process gases that form the plasma for depositing the amorphous diamond-like film layer. For example, a base layer of a first amorphous diamond-like film can be formed an then a second layer of a second amorphous diamond-like film can be formed on the first layer, where the first layer has a different composition than the second layer. In some embodiments, a first amorphous diamond-like film layer is formed from a silicone oil plasma and then a second amorphous diamond-like film layer is formed from a silicone oil and silane plasma. In other embodiments, two or more amorphous diamond-like films layers of alternating composition are formed to create the amorphous diamond-like film.

Other Plasma Deposited Barrier Coatings

Useful flexible barrier films can also include carbon-rich coatings, silicon-containing coatings, or combinations thereof that are prepared by plasma deposition as disclosed, for example, in U.S. Pat. No. 6,348,237 (Kohler et al.).

Carbon-rich coatings, as used herein, contain at least 50 atom percent carbon, and typically about 70-95 atom percent carbon, 0.1-20 atom percent nitrogen, 0.1-15 atom percent oxygen, and 0.1-40 atom percent hydrogen. Such carbon-rich coatings can be classified as "amorphous" carbon coatings, "hydrogenated amorphous" carbon coatings, "graphitic" coatings, "i-carbon" coatings, "diamond-like" coatings, etc., depending on their physical and chemical properties. Silicon-containing coatings are usually polymeric coatings that contain in random composition silicon, carbon, hydrogen, oxygen, and nitrogen.

Such coatings can be formed by means of plasma interaction with a vaporized organic material, which is normally a liquid at ambient temperature and pressure. These coatings can be uniform multi-component coatings (for example, one layer coatings produced from multiple starting materials), uniform one-component coatings, and/or multilayer coatings (for example, alternating layers of carbon-rich material and silicone materials).

Generally, the coating processes use a plasma and at least one vaporized organic material containing at least one component, wherein the vaporized organic material is capable of condensing in a vacuum of less than about 1 Torr (130 Pa). These vapors are directed toward a substrate in a vacuum (either in outer space or in a conventional vacuum chamber). This substrate is in close proximity to a radio frequency bias electrode and is preferably negatively charged as a result of being exposed to a radio frequency bias voltage. Significantly, these coatings are prepared without the need for solvents.

For example, using a carbon-rich plasma in one stream from a first source and a vaporized high molecular weight organic liquid such as dimethylsiloxane oil in another stream from a second source, a one-pass deposition procedure results in a multilayer construction of the coating (i.e., a layer of a carbon-rich material, a layer of dimethylsiloxane that is at least partially polymerized, and an intermediate or interfacial layer of a carbon/dimethylsiloxane composite). Variations in system arrangements result in the controlled formation of uniform multi-component coatings or layered coatings with gradual or abrupt changes in properties and composition as desired. Uniform coatings of one material can also be formed from a carrier gas plasma, such as argon, and a vaporized high molecular weight organic liquid, such as dimethylsiloxane oil.

A plasma (for example, an argon plasma or a carbon-rich plasma as described in U.S. Pat. No. 5,464,667 (Kohler et al.)) and at least one vaporized organic material comprising at least one component from separate sources are allowed to interact during formation of a coating. The plasma is one that is capable of activating the vaporized organic material. It can be generated using well-known means or the point source described herein. That is, the plasma can cause the vaporized organic material to become reactive, for example, as a result of radical formation, ionization, etc., although such reactive species are still capable of condensing in a vacuum to form a polymerized coating. Alternatively, the plasma can interact with the vaporized organic material as the vaporized organic material condenses on the surface in a manner such that the entire thickness of the coating is polymerized. Therefore, the plasma and vaporized organic material can interact either on the surface of the substrate or prior to contacting the surface of the substrate. Either way, the interaction of the vaporized organic material and the plasma provides a reactive form of the organic material (for example, loss of methyl group from silicone) to enable densification of the material upon formation of the coating, as a result of polymerization and/or crosslinking, for example.

Other Flexible Barrier Films

Other suitable flexible barrier films include metal foils, metallized polymer films, thin and flexible free-standing glass, and glass deposited on a polymeric film.

Desiccant

Desiccants include materials that absorb or deactivate water. Desiccants useful in the invention can comprise nearly any material that irreversibly (under ambient conditions) absorbs or reacts with water thereby removing it from the proximity of the OED to be protected. The desiccant can also absorb or deactivate oxygen and thus act as a "getter." The desiccant material can be dispersed in a polymeric binder. For some applications, transparent desiccants may be particularly useful.

The desiccant can be a water reactive metal such as, for example, calcium, lithium, sodium, potassium, and the like. It can be an oxide such as, for example, calcium oxide, barium oxide, boron oxide, or the like. Organometallic and coordination compounds such as, for example, alkyl- and alkoxy-aluminum compounds can also be used.

Preferred desiccants include moisture-reactive organic metal compounds such as those disclosed in WO 2006/093702, WO 2007/084386, and WO 2008/027863. The moisture-reactive organic metal compound is capable of reacting with water and removing the free water by a chemical reaction. The moisture-reactive organic metal compound is preferably a metal alkoxide represented by the following formula:

$$M(OR)_n$$

wherein M is Al, B, Ti or Zr, R is an alkyl group, an alkenyl group, an aryl group, a cycloalkyl group, a heterocyclic group or an acyl group, and n is the valence of M. Such a metal alkoxide is usually present in the form of a multimer.

This metal alkoxide can chemically trap water by reacting with water according to the following formula:

$$M(OR)_n + xH_2O \rightarrow M(OH)_x(OR)_{n-x} + xROH$$

As shown by the formula above, the metal alkoxide reacts with water to produce an alcohol ROH, and R in the metal alkoxide is preferably a group of giving an alcohol ROH having a boiling point of 160° C. or more, more preferably 180° C. or more.

Examples of the OR group include an alkoxyl group such as n-octyloxy group, 2-ethylhexyloxy group, decyloxy group, lauryloxy group, myristyloxy group, cetyloxy group, isostearyloxy group and 2-octyldodecyloxy group, an alicyclic alkoxyl group such as borneoxy group, isoborneoxy group and cholesteroxy group, an aromatic ring-containing alkoxyl group such as phenylethyloxy group, phenylpropyloxy group and phenoxyethyloxy group, a phenoxy group such as tert-butylphenoxy group and 4-(1,1,3,3-tetramethylbutyl)phenoxy group, a polyoxyalkylene monoalkyl ester- or monoether-oxy group such as polyoxyethylene monolauryl esteroxy group, polyoxyethylene monomethyl etheroxy group, polyoxypropylene monobutyl etheroxy group and polytetrahydrofuran monomethyl etheroxy group, a polydimethylsiloxane skeleton-containing alkoxy group, and a nitrogen-containing alkoxyl group such as 2-pyrrolidone-1-ethyl-2-oxy group and morpholinoethoxy group.

The moisture-reactive organic metal compounds described above can be provided, for example, in a photocurable hygroscopic composition. The photocurable hygroscopic composition can comprise (a) the moisture-reactive organic metal compound, (b) a (meth)acrylate, (c) a carboxyl group-containing polymerizable monomer, and (d) a photopolymerization initiator. As used herein, the term "(meth)acryl" means acryl or methacryl. A hygroscopic film can be formed by shaping the hygroscopic composition into a film form and curing the film.

The proportion of the moisture-reactive organic metal compound (a) blended is typically from about 5 to about 70 wt % based on the entire composition.

As for the (meth)acrylate, either one or both of a mono (meth)acrylate and a polyfunctional (meth)acrylate can be used. The (meth)acrylate preferably has a boiling point of about 160° C. or more, more preferably about 180° C. or more.

Examples of the mono(meth)acrylate include an alkyl (meth)acrylate such as 2-ethylhexyl(meth)acrylate, n-octyl (meth)acrylate, lauryl(meth)acrylate, stearyl(meth)acrylate, isobornyl(meth)acrylate and dicyclopentanyl(meth)acrylate, an alkylene(meth)acrylate such as phenoxyethyl(meth)acrylate, polyethylene glycol(meth)acrylate and polypropylene glycol(meth)acrylate, and an acrylamide such as N,N-dimethylamino(meth)acrylate, acryloyl morpholine, N-pyrrolidone, N,N-dimethylacrylamide and N-(2-hydroxyethyl) acrylamide.

The polyfunctional (meth)acrylate may be added so as to enhance the strength of the cured product, and examples thereof include an alkyl di(meth)acrylate such as hexanediol di(meth)acrylate, nonanediol di(meth)acrylate and tricyclodecanedimethanol di(meth)acrylate, a polyether(meth)acrylate such as polyethylene glycol di(meth)acrylate and polypropylene glycol di(meth)acrylate, a silicone di(meth) acrylate such as SILAPLANE FM7711, FM7721 and FM7725 (Chisso Corp.), and an oligo(meth)acrylate such as epoxy(meth)acrylate and urethane(meth)acrylate.

Among these, urethane(meth)acrylate and epoxy(meth) acrylate are preferred in view of flexibility and transparency of the cured product obtained. Examples of the epoxy(meth) acrylate include BLEMMER PDBE-1300 and BLEMMER 85PDPE-1500B produced by NOF Corp.; NK Oligo EA Series produced by Shin-Nakamura Chemical Co., Ltd.; and KAYARAD R Series produced by Nippon Kayaku Co., Ltd. Examples of the urethane(meth)acrylate include BLEMMER DA Series and BLEMMER DP Series produced by NOF Corp.; NK Oligo U Series and NK Oligo UA Series produced by Shin-Nakamura Chemical Co., Ltd.; ARONIX M1000 Series produced by TOAGOSEI Co., Ltd.; KAYARAD UX3000, 4000 and 6000 Series; BEAMSET 500 Series produced by Arakawa Chemical Ind., Ltd.; SHIKOH UV Series produced by The Nippon Synthetic Chemical Industry Co., Ltd.; Ebecryl Series produced by Daicel UCB; Art Resin UN Series produced by Negami Chemical Ind., Co., Ltd.; DIABEAM UK Series produced by Mitsubishi Rayon Co., Ltd.; and TEAI 1000 produced by Nippon Soda Co., Ltd.

The amount of the polyfunctional (meth)acrylate blended is such an amount that the (meth)acryloyl group in this (meth) acrylate occupies about 0.05 mol or less per 100 g of the entire composition.

The carboxyl group-containing polymerizable monomer partially reacts with the moisture-reactive organic metal compound to form a part of a polymer by photopolymerization and does not cause phase separation. Examples of the carboxyl group-containing polymerizable monomer include an acrylic acid, a methacrylic acid, a (meth)acryloylethyl phthalate, a (meth)acryloylethyl hexahydrophthalate, an ethylene oxide-modified succinic acid(meth)acrylate and a β-carboxyethyl(meth)acrylate. Among these, an acrylic acid is preferred.

The amount of the carboxyl group-containing polymerizable monomer blended is preferably from about 0.1 to about 50 mol %, preferably from about 1 to about 20 mol %, based on the moisture-reactive organic metal compound.

As for the photopolymerization initiator, examples thereof include, but are not limited to, acetophenone, diethoxyacetophenone, 2-methyl-1-[4-(methylthio)phenyl]-2-morpholinopropane-1, benzoin, benzoin ethyl ether, benzyl dimethyl ketal, benzophenone, benzylmethyl benzoylformate, 2-ethylanthraquinone, thioxanthone, diethylthioxanthone, 2,4,6-trimethylbenzoyldiphenylphosphine oxide (Lucirin TPO, trade name, produced by BASF), 2,4,6-trimethylbenzoylphenylethoxyphosphine oxide (Lucirin TPO-L, trade name, produced by BASF), bis(2,4,6-trimethylbenzoyl)phenylphosphine oxide (IRGACURE 819, produced by Ciba-Geigy), 2-hydroxy-2-methyl-1-phenylpropan-1-one (DAROCURE 1173, trade name, produced by Ciba-Geigy), 4-(2-hydroxyethoxy)phenyl-(2-hydroxy-2-propyl)ketone (IRGACURE 2959, trade name, produced by Ciba-Geigy), 4-(2-acryloyloxyethoxy)phenyl-(2-hydroxy-2-propyl)ketone, 1-hydroxycyclohexyl-phenyl ketone (IRGACURE 184, trade name, produced by Ciba-Geigy), 1-(4-isopropylphenyl)-2-hydroxy-2-methylpropan-1-one, 1-(4-dodecylphenyl)-2-hydroxy-2-methylpropan-1-one, 2-methyl-2-morpholino(4-thiomethylphenyl)propan-1-one (IRGACURE 907, trade name, produced by Ciba-Geigy), 2-benzyl-2-dimethylamino-1-(4-morpholinophenyl)-butanone (IRGACURE 369, trade name, produced by Ciba-Geigy), 2-hydroxy-2-methyl-1-[4-(1-methylviyl)phenyl]propane oligomer [ESACURE KIP 150, trade name, produced by Lamberti), N,N'-octamethylene bisacridine (ADEKA OPTOMER N1717, trade name), and acryloylbenzophenone (Ebercryl P36, trade name, produced by Daicel UCB). The photopolymerization initiator is preferably added in an amount of about 0.1 to about 5 wt % based on the composition.

Adhesive

Adhesives that are useful in the encapsulating film systems of the invention include pressure sensitive adhesives (PSAs), including curable (for example, UV curable or heat curable) PSAs; hot melts, including curable (for example, UV curable or heat curable) hot melts; and the like that have sufficient barrier properties to provide slow or minimal infiltration of oxygen and moisture through the adhesive bond line and into the encapsulated area. Low flow, film-type adhesives are preferred in embodiments in which a gap is left in the encapsulation area because they can easily maintain such a gap.

Preferred adhesives include UV curable PSAs such as ARclear™ 90453 and ARclear™ 90537 from Adhesive Research, Inc., Glen Rock, Pa.

Other preferred adhesives include adhesive compositions comprising a hydrogenated cyclic olefin-based polymer and a polyisobutylene resin such as those disclosed in WO 2007/087281. These adhesive compositions include a hydrogenated cyclic olefin-based polymer, and a polyisobutylene resin having a weight average molecular weight of 500,000 g/mole or more. The first component, which is the cyclic olefin-based polymer is generally a resin with low moisture permeability and can impact the adhesive properties of the polyisobutylene resin. Specifically, the cyclic olefin-based polymer can include, for example, hydrogenated petroleum resin obtained by hydrogenating a petroleum resin such as a tackifier. The hydrogenated petroleum resin can include a partially hydrogenated resin, a completely hydrogenated resin, or a combination thereof. The partially hydrogenated resin can have any hydrogenation ratio. In one embodiment, a completely hydrogenated resin is desirable because of its low moisture permeability and compatibility with the polyisobutylene resin.

Specific examples of the cyclic olefin-based polymer include, but are not limited to a hydrogenated terpene-based resin (for example, resins commercially available under the trade designation CLEARON P, M and K (Yasuhara Chemical)); a hydrogenated resin or hydrogenated ester-based resin (for example, resins commercially available under the trade designation FORAL AX (Hercules Inc.), FORAL 105 (Hercules Inc.), PENCEL A (Arakawa Chemical Industries. Co., Ltd.), ESTERGUM H (Arakawa Chemical Industries Co., Ltd.), and SUPER ESTER A (Arakawa Chemical Industries. Co., Ltd.); a disproportionate resin or disproportionate ester-based resin (for example, resin commercially available under the trade designation PINECRYSTAL (Arakawa Chemical Industries Co., Ltd.); a hydrogenated dicyclopentadiene-based resin which is a hydrogenated resin of a C5-type petroleum resin obtained by copolymerizing a C5 fraction such as pentene, isoprene, piperine and 1,3-pentadiene produced through thermal decomposition of petroleum naphtha (for example, resins commercially available under the trade designations ESCOREZ 5300 (Exxon Chemical Co.), ESCOREZ 5400 (Exxon Chemical Co.), and EASTOTAC H (Eastman Chemical Co.)); a partially hydrogenated aromatic modified dicyclopentadiene-based resin (for example, resin commercially available under the trade designation ESCOREZ 5600 (Exxon Chemical Co.)); a resin resulting from hydrogenation of a C9-type petroleum resin obtained by copolymerizing a C9 fraction such as indene, vinyltoluene and α- or β-methylstyrene produced by thermal decomposition of petroleum naphtha (for example, resins commercially available under the trade designation ARCON P or ARCON M (Arakawa Chemical Industries Co., Ltd.)); and a resin resulting from hydrogenation of a copolymerized petroleum resin of the above-described C5 fraction and C9 fraction (for example, resin commercially available under the trade designation IMARV (Idemitsu Petrochemical Co.)). In one embodiment, the cyclic olefin-based polymer is a hydrogenated dicyclopentadiene-based resin because of its low moisture permeability and transparency.

Cyclic olefin-based polymers that can be utilized in adhesive encapsulating compositions typically have a weight average molecular weight from about 200 to 5,000 g/mole. In another embodiment, the weight average molecular weight of the cyclic olefin-based polymer is from about 500 to 3,000 g/mole. If the weight average molecular weight exceeds 5,000 g/mole, poor tackification may result or the compatibility with the polyisobutylene-based resin may decrease.

In an adhesive encapsulating composition, the cyclic olefin-based polymer can be blended with the polyisobutylene resin at various ratios. Generally, about 20 to 90 wt % cyclic olefin-based polymer is blended with about 10 to 80 wt % polyisobutylene resin. In another embodiment, about 20 to 70 wt % cyclic olefin-based polymer is blended with about 30 to 80 wt % polyisobutylene resin.

The second component, which is the polyisobutylene resin, is generally a resin having a polyisobutylene skeleton in the main or a side chain. Fundamentally, such a polyisobutylene resin can be prepared by polymerizing isobutylene alone or a combination of isobutylene and n-butene, isoprene, or butadiene in the presence of a Lewis acid catalyst such as aluminum chloride or boron trifluoride. Suitable polyisobutylene resins are commercially available under the trade designation VISTANEX (Exxon Chemical Co.), HYCAR (Goodrich Corp.), OPANOL (BASF AG), and JSR BUTYL (Japan Butyl Co., Ltd.).

The polyisobutylene resin generally has a solubility parameter (SP value), which is an index for characterizing the polarity of a compound, that is similar to that of the cyclic olefin-based polymer (the first component) and exhibits good compatibility (i.e., miscibility) with the cyclic olefin-based polymer so that a transparent film can be formed. Also, as compared with many aromatic ring-containing organic compounds used for the light-emitting layer or the charge transfer layer of an organic EL device, this resin generally has lower polarity and higher viscosity. Even when the organic EL device is in contact with the encapsulant, its constituent elements typically are not attacked. Furthermore, the polyisobutylene resin has a low surface energy and therefore, when this resin is used in a viscous adhesive encapsulating composition, the adhesive is readily spread onto an adherent and the generation of voids at the interface is minimized. In addition, the glass transition temperature and the moisture permeability are low and therefore, the polyisobutylene resin is suitable as the base resin of the adhesive encapsulating composition.

The polyisobutylene resin usually has a weight average molecular weight (polystyrene-reduced molecular weight by GPC) of about 300,000 g/mole or more. In another embodiment, the polyisobutylene resin often has a weight average molecular weight of about 500,000 g/mole or more. With a higher molecular weight, the adhesive encapsulating composition that is prepared can have a wide rubber plateau region and can maintain sufficiently high heat resistance and peel strength.

The polyisobutylene resin may have various viscosities according to the formulation of the adhesive encapsulating composition. When defined by the viscosity as measured by intrinsic viscosity at 20° C. in diisobutylene, the polyisobutylene resin usually has a viscosity average molecular weight of about 100,000 to 10,000,000 g/mole or about 500,000 to 5,000,000 g/mole.

Another embodiment includes an adhesive encapsulating composition that includes a hydrogenated cyclic olefin-based polymer, a polyisobutylene resin, a photocurable resin, and a photopolymerization initiator. The hydrogenated cyclic olefin-based polymer, and the polyisobutylene resin are as discussed above.

The photocurable resin can enhance the fluidity of an adhesive encapsulating composition before it is cured, and can enhance the wettability of the composition for the adherent. Embodiments that include a photocurable resin can increase the adhesion and retention strength of the adhesive encapsulating composition because of the curing of the resin.

The photocurable resin can be saturated or unsaturated and can be aliphatic, alicyclic, aromatic or heterocyclic. In some embodiments, saturated long-chain alkyl(meth)acrylates, cycloaliphatic(meth)acrylates, epoxy resins, or combinations thereof can be utilized because they can enhance the miscibility of the hydrogenated cyclic aliphatic hydrocarbon resin and the polyisobutylene. The resins can be unsubstituted or substituted with various groups such as hydroxy or alkoxy groups.

Exemplary long chain alkyl(meth)acrylate photocurable resins include, but are not limited to, octyl(meth)acrylate, stearyl(meth)acrylate, 1,9-nonandiol di(meth)acrylate, 1,10-decandiol di(meth)acrylate, and hydrogenated polybutadiene di(meth)acrylate resin. Exemplary cycloaliphatic(meth)acrylate photocurable resins include, but are not limited to, isobornyl(meth)acrylate, tetramethylpiperidiyl methacrylate, pentamethylpiperidiyl methacrylate, dicyclopentanyl(meth) acrylate, dicyclopentenyl(meth)acrylate, tri-cyclodecanediol di(meth)acrylate, and tri-cyclodecane di-methanoldi(meth) acrylate. Exemplary epoxy photocurable resins include, but are not limited to, epoxidized linseed oil, epoxidized polybutadiene, polyisobutene oxide, α-pinene oxide, limonene dioxide, 3,4-epoxycyclohexylmethyl-3,4-epoxycyclohexane carboxylate, tri-cyclodecane di-methanol diglycidyl ether, hydrogenated bisphenol A diglycidyl ether, and 1,2-bis [(3ethyl-3oxthethanylmethoxy)methyl]benzene.

In some embodiments, photocurable resins that contain more than one curable group are utilized. It will also be understood by one of skill in the art that mixtures of photocurable resins can be utilized.

Generally, photocurable resins are present in adhesive encapsulating compositions in amounts from 5 weight % to 50 weight %. In some embodiments, if the photocurable resin is present in an amount less than 5 weight %, the composition does not provide enough adhesion and retention strength. In some embodiments, if the photocurable resin is present in an amount greater than 50 weight %, the moisture permeability or flexibility of the final adhesive encapsulating layer can be low. If a low moisture permeability is particularly desired, the photocurable resin can generally be present in an amount from 5 weight % to 20 weight %. Such low amounts can be desirable in such situations because the photocurable resins generally have higher moisture permeability than hydrogenated cyclic olefin-based polymers or polyisobutylene resins.

In embodiments that include a photopolymerization initiator, generally, either photo radical initiators or cationic initiators can be utilized. Generally, the choice of initiator will depend at least in part on the particular photocurable resin that is included in the adhesive encapsulating composition.

Exemplary photo radical initiators include, but are not limited to, acetophenone, diethoxyacetophenone, 2-[4-(methylthio)-methyl-1-phenyl]-2-morphorino propanone, benzoin, benzoin ethyl ether, benzylmethyl ketal, benzophenone, benzylmethylbenzoyl formate, 2-ethylanthraquinone, thioxanthone, diethylthioxanthone, 2,4,6-trimethylbenzoyl diphenylphosphine oxide (commercially available under the trade designation LUCIRIN TPO from BASF AG), 2,4,6-trimethylbenzoyl diphenylethoxyphosphine oxide (commercially available under the trade designation LUCIRIN TPO-L from BASF AG), bis(2,4,6-trimethyl benzoyl)phenyl phosphine oxide (commercially available under the trade designation IRGACURE 819 from Ciba-Geigy Co.), 2-hydroxy-2-methyl-1-phenyl propane-1-one (commercially available under the trade designation DAROCURE 1173 from Ciba-Geigy Co.), 4-(2-hydroxyethoxy)phenyl(2-hydroxy-2-propyl)ketone (commercially available under the trade designation IRGACURE 2959 from Ciba-Geigy Co.), 4-(2-acrylyloxyethoxy)phenyl-(2-hydroxy-2-propyl)ketone, 1-hydroxycyclohexyl phenyl ketone (commercially available under the trade designation IRGACURE 184 from Ciba-Geigy Co.), 1-(4-isopropylphenyl)-2-hydroxy-2-methylpropane-1-one, 1-(4-dodecylphenyl)-2-hydroxy-2-methylpropane-1-one, 2-methyl-2-morphorino(4-thiomethylphenyl)propane-1-one (commercially available under the trade designation IRGACURE 907 from Ciba-Geigy Co.), 2-benzil-2-dimethylamino-1-(4-morpholinophenyl)-butanone (commercially available under the trade designation IRGACURE 369 from Ciba-Geigy Co.), N,N-octamethylene bis acridine (commercially available under the trade designation ADEKA OPTOMER N1717 from ADEKA Corp.), and acryloyl benzophenone (commercially available under the trade designation EBERCRYL P36 from Cytec Industries Inc. Co., Ltd.).

In one embodiment, onium salts, can be utilized because of their low level of metal ion contamination. Onium salts include, but are not limited to, iodonium, sulfonium and phosphonium complex salts. Generally useful onium salts can be of the general formula $Y^+X^-$. Y can include aryldialkylsulfonium, alkyldiarylsulfonium, triarylsulfonium, diaryliodonium and tetraaryl phosphonium cations, where each alkyl and aryl group can be substituted. X can include $PF_6^-$, $SbF_6^-$, $CF_3SO_3^-$, $(CF_3SO_2)_2N^-$, $(CF_3SO_2)_3C^-$, $(C_6F_5)_4B^-$ anions.

Examples of photo cationic initiators include, but are not limited to, those commercially available under the trade designation UVI-6990 or UVI-6974 from Union Carbide Corp., SP-150 or SP-170 from ADEKA Corp., SI-180 or SI-110 Sanshin Chemical Co., KI-85 from Degussa AG, PHOTO-INITIATOR 2074 from Rodia Inc., and CI-2734, CI-2855, CI-2823, or CI-2758 from Nippon Soda Co., Ltd.

It will also be understood by one of skill in the art that mixtures of photopolymerization initiators can be utilized.

Generally, the photopolymerization initiator is present in an amount from 0.01 weight % to 5 weight % based on the weight of the adhesive encapsulating composition. In some embodiments where the amount of photopolymerization initiator is less than 0.01 weight %, the curing of the adhesive encapsulating composition is slower than desired. In some embodiments where the amount of photopolymerization initiator is greater than 5 weight %, the amount of out gassing from the adhesive encapsulating composition is higher than desired.

Optionally, the adhesive can contain desiccant. Desiccant loaded adhesives are described, for example, in U.S. Pat. No. 6,936,131 (McCormick et al.).

Release Liner

A release liner can be utilized in the flexible encapsulating film systems of the invention to protect the adhesive prior to bonding the encapsulating film system to an OED substrate. Release liners known in the art can be used. Examples of useful release liners include kraft paper coated with silicones and the like; polypropylene film; Teflon™ film; and polyester and other polymer films coated with silicones, fluorocarbons, and the like.

In some embodiments, the release liner has oxygen and moisture barrier properties. For example, the release liner may have an oxygen transmission rate less than about 0.1 cc/m$^2$/day at 23° C. and 90% relative humidity. In such embodiments, the release liner also serves to protect the desiccant from ambient atmosphere and therefore prevents its depletion prior to use on an OED. Examples of release liners with barrier properties include known barrier films (for example, barrier films used in food packaging) treated with a release coating such as a silicone or fluorocarbon coating. The films described above as flexible barrier films could also be treated with release coating and used as release liner with barrier properties.

Optional Protective Layer

In some embodiments, it is desirable to physically separate or electrically isolate the desiccant from the OED. For example, a reactive metal desiccant has electrical conductivity that could cause electrical shorts if it were in direct contact with certain types of OEDs (for example, pixilated. Therefore, the flexible encapsulating film systems of the invention can include a protective layer to physically and electrically isolate the desiccant from the OED. Protective layers can also prevent flakes or particles of desiccant from spalling off the barrier film and damaging the OED.

Suitable protective layers should be at least partially permeable to oxygen and moisture so that the desiccant is not isolated from the OED encapsulation area. Examples of suitable protective layer materials include porous ceramics (for example, thin sputtered alumina) and polymers with known oxygen and water transporting capabilities (for example, polyimides, polyurethanes, polyacrylamindes, polyalkylene glycols, and the like). Preferably, the protective layer is a dielectric layer (for example, an insulating ceramic or polymeric film) that can prevent electrical shorting.

Other Optional Features

Various functional layers or coatings can be added to the barrier assemblies to alter or improve their physical or chemical properties, particularly at the surface of the barrier film. Such layers or coatings can include, for example, visible light-transmissive conductive layers or electrodes (e.g., of indium tin oxide); antistatic coatings or films; flame retardants; UV stabilizers; abrasion resistant or hardcoat materials; optical coatings; anti-fogging materials; anti-reflection coatings; anti-smudging coatings; polarizing coatings; anti-fouling materials; magnetic or magneto-optic coatings or films; photographic emulsions; prismatic films; holographic films or images; adhesives such as pressure sensitive adhesives or hot melt adhesives; primers to promote adhesion to adjacent layers; and low adhesion backsize materials for use when the barrier assembly is to be used in adhesive roll form. These functional components can be incorporated into one or more of the outermost layers of the barrier assembly or can be applied as a separate film or coating.

Various optional features can be included in the flexible encapsulation film systems of the invention. Examples of optional features include moisture exposure indicators, graphics, and spacer structures. A moisture exposure indicator could be included to provide an indication as to the condition of the desiccant prior to use of the flexible encapsulation film system. The flexible encapsulation film system could be treated with inks or other printed indicia such as those used to display product identification, orientation or alignment information, advertising or brand information, decoration, or other information. Various techniques can be used to print on the flexible encapsulation film system such as, for example, screen printing, inkjet printing, thermal transfer printing, letterpress printing, offset printing, flexographic printing, stipple printing, laser printing, and the like. Spacer structures could be included, for example, in the adhesive, to maintain specific bond line thickness. Spacer structures could also be included in appropriate locations (for example, within the area surrounded by the adhesive) to limit the deformation of the flexible barrier film and thereby reduce the possibility of abrasive damage to the OED by the encapsulation system.

Method of Manufacture

The flexible encapsulating film systems of the invention can be made using the following three steps: (1) obtaining a flexible barrier film, (2) depositing adhesive on at least a portion of the flexible barrier film, and (3) depositing desiccant. Obtaining a flexible barrier film is always the first step. The other two steps, however, can vary in order.

The first step involves fabricating a flexible barrier film or otherwise obtaining a flexible barrier film (for example, purchasing commercially available flexible barrier film). Preferably, the flexible barrier film is in a roll format.

In one embodiment of the method of the invention of making a flexible barrier film, the desiccant is deposited on at least a portion of the flexible barrier film in the second step. Deposition of the desiccant can be accomplished, for example, by vapor deposition of materials such as calcium, lithium, sodium, potassium, boron oxide, alkyl- and alkoxy-aluminum compounds, and the like. Reactive metals and desiccating oxides such as, for example, CaO and BaO can be deposited by sputtering or reactive sputtering. Shadow masking techniques can be used when vapor depositing desiccant to pattern the desiccant such that it is placed only in specific areas of the flexible barrier film. Desiccants in a polymeric binder (for example, CaO, BaO, or aluminum compounds in a polymeric binder) can be deposited on the flexible barrier film using solution-based coating or printing techniques (for example, knife or spray coating (optionally through a mask or stencil), screen printing, flexographic printing, and the like), or if the polymeric binder is sticky (for example, a PSA or hot melt), it can be laminated onto the flexible barrier film. Alternatively, desiccant films can be placed on the flexible barrier film using adhesives or thermal transfer techniques. If desired, the desiccant can be overcoated with an optional protective layer.

In this embodiment, the third step is adding adhesive to at least a portion of the flexible barrier film. Typically, the adhesive is placed such that the periphery of the desiccant area is surrounded by the adhesive. For some optical applications, however, it is preferable to completely cover the desiccant area with adhesive such that when the flexible encapsulation film system is adhered to an OED substrate, the adhesive fills the gap between the OED and the desiccant. The adhesive can be provided, for example, by printing techniques such as screen printing, offset printing, inkjet printing, or flexographic printing using solutions of adhesive components or 100% solid compositions of curable monomers and/or oligomers, which are subsequently dried, cured, or partially cured to form the adhesive.

A release liner can then be applied to the flexible encapsulation film system to protect the adhesive until the encapsulation system is used. Alternatively, the adhesive can be preformed on (or between) liners in the form of an adhesive transfer film. This construction can optionally have openings in the adhesive. For example, this construction can be kiss-cut to form an opening in the adhesive film or openings can be formed by printing techniques. The transfer adhesive can then be laminated to the flexible barrier film such that the opening in the adhesive is in registration with the desiccant. The liner can be left in place or it can be replaced with a different release liner with, for example, better barrier properties.

In a second embodiment of the method of the invention of making a flexible barrier film, the adhesive is deposited (for example, as described above) on at least a portion of the flexible barrier film in the second step. Then, a desiccant is deposited (for example, as described above) on at least a portion of the flexible barrier film. This embodiment of the method is typically utilized for making flexible encapsulating film systems in which the adhesive surrounds the periphery of the desiccant area (for example, such that the adhesive will form a "gasket" around the desiccant when the flexible encapsulating system is adhered to a substrate). An advantage of this embodiment of the method of making a flexible barrier film is that, if desired, a release liner can be placed on the adhesive prior to depositing the desiccant and the release liner can be used as a deposition mask for depositing the desiccant.

In a third embodiment of the method of the invention of making a flexible barrier film, the adhesive is deposited (for example, as described above) on at least a portion of the flexible barrier film and then a desiccant is deposited (for example, as described above) on at least a portion of the adhesive. In this embodiment, it is also possible to place a release liner on at least a portion of the adhesive to use the release liner as a deposition mask for depositing the desiccant.

The entire fabrication of the flexible encapsulation film system can be done in a batch mode to create a single flexible encapsulating "lid" or a sheet comprising multiple lids. Alternatively, the process can be done in a continuous web mode to create rolls of film comprising multiple lids. In batch or web processes, the flexible barrier film can form the entire substrate or web. The barrier film can, for example, be in a roll form. When the barrier film is in a roll form, the backside of the barrier film preferably comprises a release material. The backside of the barrier film can then serve to protect the desiccant from ambient atmosphere and prevent its depletion prior to use on an OED, but without the additional materials and processing costs associated with a separate release liner.

Alternatively, smaller pieces of flexible barrier film can be adhered to a carrier sheet or web for processing. The carrier web with the pieces of flexible barrier film can, for example, be in a roll form. When the carrier web is in a roll form, the backside of the carrier web preferably comprises a release material. The backside of the carrier web can then serve to protect the desiccant from ambient atmosphere and prevent its depletion prior to use on an OED, but without the additional materials and processing costs associated with a separate release liner.

In another embodiment, individual flexible encapsulating lids could be processed and converted using the flexible barrier film without a carrier film and then subsequently be placed on a carrier web or film.

Figure 6:
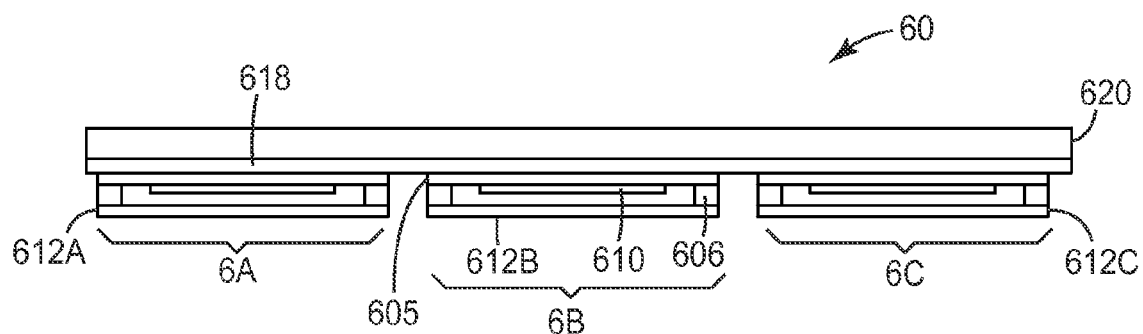
FIG. 6 illustrates a singulated encapsulating film system of the invention.
Figure 7:
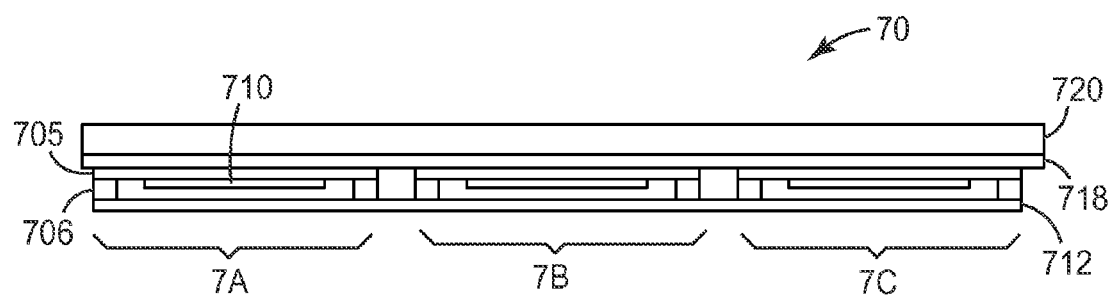
FIG. 7. illustrates another singulated encapsulating film system of the invention.

FIG. 6 illustrates a "singulated" encapsulating film system of the invention. Singulated encapsulating film system 60 includes three flexible barrier lids 6A, 6B, 6C adhered with removable adhesive 618 to a carrier web 620. Each flexible barrier lid 6A, 6B, 6C comprises a flexible barrier film 605, desiccant 610, and adhesive 606. Each flexible barrier lid 6A, 6B, 6C has a separate release liner 612A, 612B, 612C. FIG. 7 also illustrates a singulated encapsulating film system of the invention. Singulated encapsulating film system 70 is similar to singulated encapsulating film system 60, except flexible barrier lids 7A, 7B, 7C have a continuous release liner 712 covering all of them.

The singulated encapsulating systems in FIGS. 6 and 7 include three flexible barrier lids for illustrative purposes. Singulated encapsulating systems of the invention may include any number of flexible barrier lids.

A single release liner can be used to cover groups, even large groups, of flexible barrier lids. A singulated encapsulating film system of the invention with, for example, 25 flexible barrier lids and a single release liner covering all 25 flexible barrier lids, can be used to encapsulate 25 corresponding OLEDs contained on a single device substrate by removing the release liner and sticking the entire group of flexible barrier lids onto device substrate.

After the flexible encapsulation film system is assembled, the individual units, sheets, or rolls can be further protected from ambient atmosphere by placing them in high barrier packaging materials such as, for example, pouches made from barrier materials similar to the flexible barrier films described above, glass containers, metal cans, and the like. Desiccants and inert atmospheres can be incorporated in this packaging to protect the flexible encapsulation film system during shipment.

Method of Use

Figure 8:
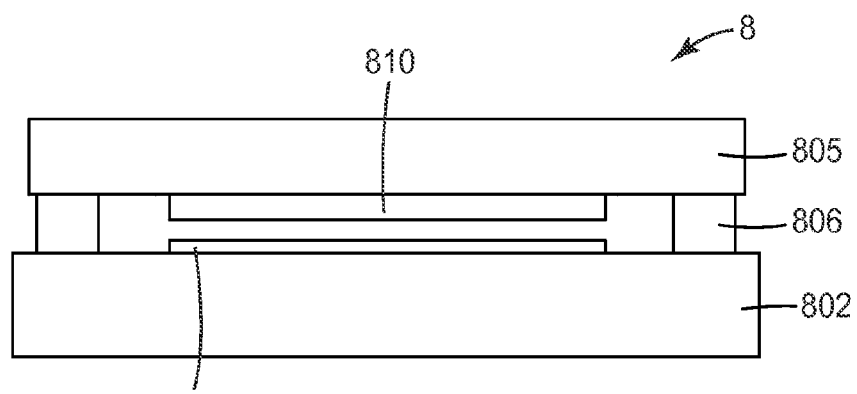
FIG. 8 illustrates a flexible encapsulating film system of the invention encapsulating an OLED using a schematic side view.

The flexible encapsulation film systems of the invention can be used to encapsulate electronic devices such as thin film transistors (including OTFTs), photovoltaic cells (including OPVs) or solar cells (for example, CIGS), light emitting diodes (including OLEDs, electroluminescent films, and the like. FIG. 8 illustrates a flexible encapsulation film system of the invention 8 being used to encapsulate an OLED 800 by attaching the system to the OLED substrate 802 with the adhesive 806.

Figure 9:
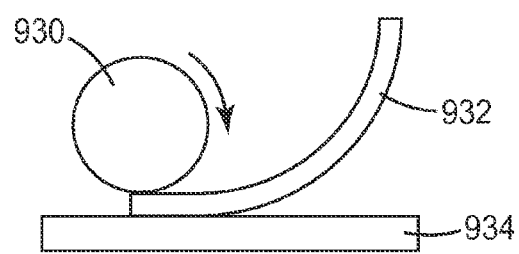
FIG. 9 illustrates an apparatus for applying a flexible encapsulating film system of the invention using a schematic side view.

An electronic device manufacturer can use flexible encapsulation film systems of the invention, for example, as follows. Flexible encapsulation film systems can be shipped to an electronic device manufacturer in suitable packaging (for example, in hermetic packaging). The system can be unpacked and placed in suitable encapsulating tooling under inert atmosphere by the electronic device manufacturer. The release liner can then be removed and the flexible encapsulation film system can be applied to an electronic device. The electronic device to be encapsulated can flexible or rigid and the device-bearing substrate can be flexible or rigid. Application can be accomplished, for example, with a roller-type apparatus such as the apparatus depicted in FIG. 9. The application roller 930 rolls over the encapsulating film 932 and presses it onto the device-bearing substrate 934. Other methods can be used to apply the flexible encapsulation film system. Preferably the methods provide good bonding or bond lines essentially free of voids, and allow for appropriate registration of the bond line with the device to be encapsulated. Once the encapsulating film is in place, additional pressure can be applied to the bond lines to ensure a good seal. Energy such as heat and/or UV irradiation can be applied to the bond lines to induce some flow and/or cure the adhesive to lower its moisture and oxygen permeability. The flexible encapsulating film system can be applied to individual electronic devices that have already been singulated from a mother sheet or it can be applied to multiple electronic devices on a mother sheet prior to singulation. The encapsulation process can be done in batch mode or in a continuous web mode.

We claim:

1. An encapsulating film system comprising:
   (a) a flexible barrier film comprising a multilayer film assembly comprising at least one inorganic film layer and at least one organic film layer;
   (b) an adhesive on at least a portion of the flexible barrier film; and
   (c) a desiccant on at least a portion of the flexible barrier film or the adhesive,
   wherein the desiccant contacts at least a portion of the adhesive,
   further wherein the multilayer film assembly comprises a flexible substrate overcoated with a first polymer layer having a Tg greater than or equal to that of HSPET and further overcoated with at least two inorganic barrier layers separated by at least one second polymer layer having a Tg greater than or equal to that of HSPET, and further wherein the flexible barrier film has a water vapor transmission rate less than about 0.005 g/m$^2$/day at 38° C. and 100% relative humidity.

2. The encapsulating film system of claim 1 wherein the flexible substrate is light-transmissive.

3. The encapsulating film system of claim 1 wherein the flexible substrate has a Tg greater than or equal to that of HSPET.

4. The encapsulating film system of claim 1 wherein the first or second polymer layer comprises a polymer of cyclohexane dimethanol diacrylate ester, isobornyl methacrylate, cyclic diacrylate, or tris(2-hydroxy ethyl) isocyanurate triacrylate.

5. The encapsulating film system of claim 1 wherein at least one inorganic barrier layer comprises a metal oxide.

6. The encapsulating film system of claim 1 wherein the flexible barrier film comprises a diamond-like layer selected from a diamond-like carbon layer or a diamond-like glass layer.

7. The encapsulating film system of claim 6 wherein the diamond-like layer is overcoated on a polymer layer and the polymer layer is overcoated on a flexible substrate.

8. The encapsulating film system of claim 7 wherein the polymer layer and the diamond-like layer comprises a dyad and wherein the flexible barrier film has a plurality of the dyads overcoated on the substrate.

9. The encapsulating film system of claim 8 further comprising an additional layer between at least two of the dyads.

10. The encapsulating film system of claim 1 wherein the flexible barrier film comprises a diamond-like film layer.

11. The encapsulating film system of clam 10 wherein the diamond-like film layer was fabricated using a plasma formed from silicone oil.

12. The encapsulating film system of claim 11 wherein the diamond-like film layer is overcoated on a polymer layer.

13. The encapsulating film system of claim 1 further comprising a protective layer on the desiccant, wherein the protective layer is at least partially permeable to oxygen and moisture.

14. The encapsulating film system of claim 1 further comprising a release liner on the adhesive.

15. The encapsulating film system of claim 1 further comprising a moisture exposure indicator.

16. The encapsulating film system of claim 1 further comprising one or more spacer structures.

17. The encapsulating film system of claim 1 further comprising a functional layer or coating on the flexible barrier film.

18. The encapsulating film system of claim 1 wherein the barrier film is in a roll form and the backside of the barrier film comprises a release material.

* * * * *

UNITED STATES PATENT AND TRADEMARK OFFICE
CERTIFICATE OF CORRECTION

PATENT NO. : 8,846,169 B2
APPLICATION NO. : 12/810115
DATED : September 30, 2014
INVENTOR(S) : Fred McCormick et al.

It is certified that error appears in the above-identified patent and that said Letters Patent is hereby corrected as shown below:

In the Specification

Column 3
Line 38, Delete "Kanegafugi" and insert -- Kanegafuchi --, therefor.

Column 7
Line 35, Delete "Kanegafugi" and insert -- Kanegafuchi --, therefor.

Column 9
Line 26, Delete "polytetrafluoroethyloene" and insert -- polytetrafluoroethylene --, therefor.

Column 12
Line 34, Delete "naphthloxyethyl" and insert -- naphthyloxyethyl --, therefor.

Column 19
Line 15, Delete "(Ebercryl" and insert -- (Ebecryl --, therefor.

Column 19
Line 59, Delete "PENCEL" and insert -- PENCIL --, therefor.

Column 21
Line 44, Delete "tetramethylpiperidiyl" and insert -- tetramethylpiperidyl --, therefor.

Column 21
Line 47, Delete "di-methanoldi" and insert -- di-methanol di --, therefor.

Column 22
Lines 28-29, Delete "4-(2-acrylyloxyethoxy)" and insert -- 4-(2-acryloyloxyethoxy) --, therefor.

Signed and Sealed this
Twenty-first Day of April, 2015

Michelle K. Lee
*Director of the United States Patent and Trademark Office*

CERTIFICATE OF CORRECTION (continued)
U.S. Pat. No. 8,846,169 B2

Column 22
Line 43, Delete "EBERCRYL" and insert -- EBECRYL --, therefor.

Column 23
Line 47, Delete "polyacrylamindes," and insert -- polyacrylamides, --, therefor.

In the Claims

Column 28
Line 9 (approximately), Claim 8, delete "comprises" and insert -- comprise --, therefor.

Column 28
Line 17 (approximately), Claim 11, delete "clam" and insert -- claim --, therefor.